(12) United States Patent
Yun et al.

(10) Patent No.: US 10,957,607 B2
(45) Date of Patent: *Mar. 23, 2021

(54) SEMICONDUCTOR DEVICE AND METHOD FOR MANUFACTURING THE SAME

(71) Applicant: TAIWAN SEMICONDUCTOR MANUFACTURING COMPANY LTD., Hsinchu (TW)

(72) Inventors: Wei-Sheng Yun, Taipei (TW); You-Ru Lin, New Taipei (TW); Shao-Ming Yu, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/727,929

(22) Filed: Dec. 27, 2019

(65) Prior Publication Data
US 2020/0144132 A1 May 7, 2020

Related U.S. Application Data

(63) Continuation of application No. 15/960,233, filed on Apr. 23, 2018, now Pat. No. 10,522,418.
(Continued)

(51) Int. Cl.
*H01L 21/8238* (2006.01)
*H01L 21/02* (2006.01)
(Continued)

(52) U.S. Cl.
CPC ...... *H01L 21/823821* (2013.01); *B82Y 10/00* (2013.01); *H01L 21/027* (2013.01);
(Continued)

(58) Field of Classification Search
CPC ......... H01L 21/02645; H01L 21/02008; H01L 21/02035; H01L 21/823412;
(Continued)

(56) References Cited

U.S. PATENT DOCUMENTS

| 9,570,551 B1* | 2/2017 | Balakrishnan | H01L 29/0673 |
| 2007/0210381 A1* | 9/2007 | Sadaka | H01L 21/76256 257/347 |

(Continued)

*Primary Examiner* — Feifei Yeung Lopez
(74) *Attorney, Agent, or Firm* — WPAT, P.C., Intellectual Property Attorneys; Anthony King

(57) ABSTRACT

A method for manufacturing a semiconductor device is provided. A semiconductor substrate is received. The semiconductor substrate is patterned to form a plurality of protrusions spaced from one another, wherein the protrusion comprises a base section, and a seed section stacked on the base section. A plurality of first insulative structures are formed, covering sidewalls of the base sections and exposing sidewalls of the seed sections. A plurality of spacers are formed, covering the sidewalls of the seed sections. The first insulative structures are partially removed to partially expose the sidewalls of the base sections. The base sections exposed from the first insulative structures are removed. A plurality of second insulative structures are formed under the seed sections.

20 Claims, 40 Drawing Sheets

Related U.S. Application Data

(60) Provisional application No. 62/578,840, filed on Oct. 30, 2017.

(51) Int. Cl.

| | | |
|---|---|---|
| *H01L 25/065* | (2006.01) | |
| *H01L 21/76* | (2006.01) | |
| *H01L 21/027* | (2006.01) | |
| *B82Y 10/00* | (2011.01) | |
| *H01L 27/06* | (2006.01) | |
| *H01L 29/78* | (2006.01) | |
| *H01L 29/423* | (2006.01) | |
| *H01L 29/775* | (2006.01) | |
| *H01L 21/8234* | (2006.01) | |
| *H01L 27/088* | (2006.01) | |
| *H01L 29/786* | (2006.01) | |
| *H01L 29/66* | (2006.01) | |
| *H01L 21/822* | (2006.01) | |
| *H01L 29/06* | (2006.01) | |
| *H01L 29/10* | (2006.01) | |

(52) U.S. Cl.
CPC .. *H01L 21/02008* (2013.01); *H01L 21/02035* (2013.01); *H01L 21/02532* (2013.01); *H01L 21/02645* (2013.01); *H01L 21/76* (2013.01); *H01L 21/8221* (2013.01); *H01L 21/823412* (2013.01); *H01L 21/823431* (2013.01); *H01L 21/823481* (2013.01); *H01L 25/0657* (2013.01); *H01L 27/0688* (2013.01); *H01L 27/0886* (2013.01); *H01L 29/0673* (2013.01); *H01L 29/1054* (2013.01); *H01L 29/1079* (2013.01); *H01L 29/42392* (2013.01); *H01L 29/66439* (2013.01); *H01L 29/66795* (2013.01); *H01L 29/775* (2013.01); *H01L 29/785* (2013.01); *H01L 29/7842* (2013.01); *H01L 29/7849* (2013.01); *H01L 29/78696* (2013.01)

(58) Field of Classification Search
CPC ..... H01L 21/823431; H01L 21/823821; H01L 27/0886; H01L 29/7842; H01L 29/7849
See application file for complete search history.

(56) References Cited

U.S. PATENT DOCUMENTS

| | | | |
|---|---|---|---|
| 2010/0163971 A1* | 7/2010 | Hung | H01L 29/1083 257/327 |
| 2015/0053912 A1* | 2/2015 | Ching | H01L 21/823431 257/9 |
| 2016/0104799 A1* | 4/2016 | Qi | H01L 29/1054 257/29 |

* cited by examiner

SEMICONDUCTOR DEVICE AND METHOD FOR MANUFACTURING THE SAME

PRIORITY CLAIM AND CROSS-REFERENCE

This application is a continuation of application Ser. No. 15/960,233 filed on Apr. 23, 2018, now allowed, which claims priority of U.S. provisional application Ser. No. 62/578,840 filed on Oct. 30, 2017. All of which are incorporated by reference in their entirety.

BACKGROUND

In recent years, strain relaxed buffer (SRB) is grown on a bulk semiconductor substrate such as a silicon substrate, and used as a virtual substrates (VS) to epitaxially grow another semiconductor material of a different lattice constant than the bulk substrate. The SRB, however, suffers from defect issue, and the thickness of the epitaxially grown semiconductor material is limited by its theoretical critical thickness.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
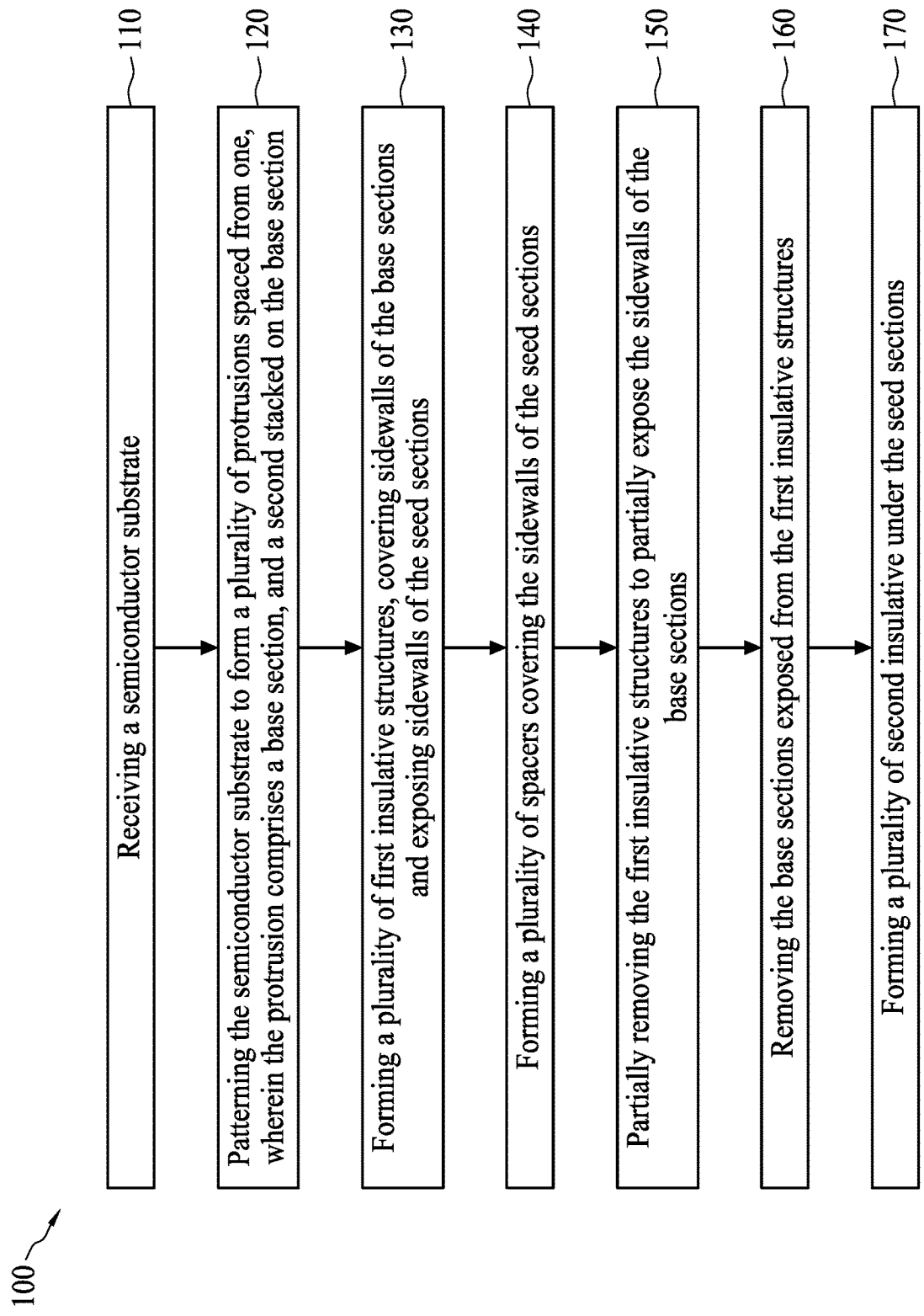
FIG. 1 is a flow chart illustrating a method for manufacturing a semiconductor device in accordance with various aspects of one or more embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "above", "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

As used herein, the term "semiconductor substrate" may refer to a bulk semiconductor substrate or a composite semiconductor substrate including a semiconductor base and a semiconductor seed layer stacked on the semiconductor base.

In one or more embodiments of the present disclosure, a semiconductor seed layer with a thickness less than its critical thickness is used as a seed layer and a strain transfer medium. The substantially defect-free semiconductor seed layer allows another semiconductor layer epitaxially grown thereon to be strained. The semiconductor seed layer also allows the semiconductor layer epitaxially grown thereon to be substantially defect-free even when its thickness exceeds its theoretical critical thickness. The semiconductor seed layer may be a portion of a bulk semiconductor substrate, or a semiconductor layer grown on a semiconductor base.

FIG. 1 is a flow chart illustrating a method for manufacturing a semiconductor device in accordance with various aspects of one or more embodiments of the present disclosure. The method 100 begins with operation 110 in which a semiconductor substrate is received. The method 100 proceeds with operation 120 in which the semiconductor substrate is patterned to form a plurality of protrusions spaced from one another. Each of the protrusion includes a base section, and a seed section stacked on the base section. The method 100 continues with operation 130 in which a plurality of first insulative structures are formed to cover sidewalls of the base sections and expose sidewalls of the seed sections. The method 100 proceeds with operation 140 in which a plurality of spacers are formed, covering the sidewalls of the seed sections. The method 100 continues with operation 150 in which the first insulative structures are partially removed to partially expose the sidewalls of the base sections. The method 100 proceeds with operation 160 in which the base sections are exposed from the first insulative structures are removed. The method 100 continues with operation 170 in which a plurality of second insulative structures are formed under the seed sections.

The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method.

Figure 2:
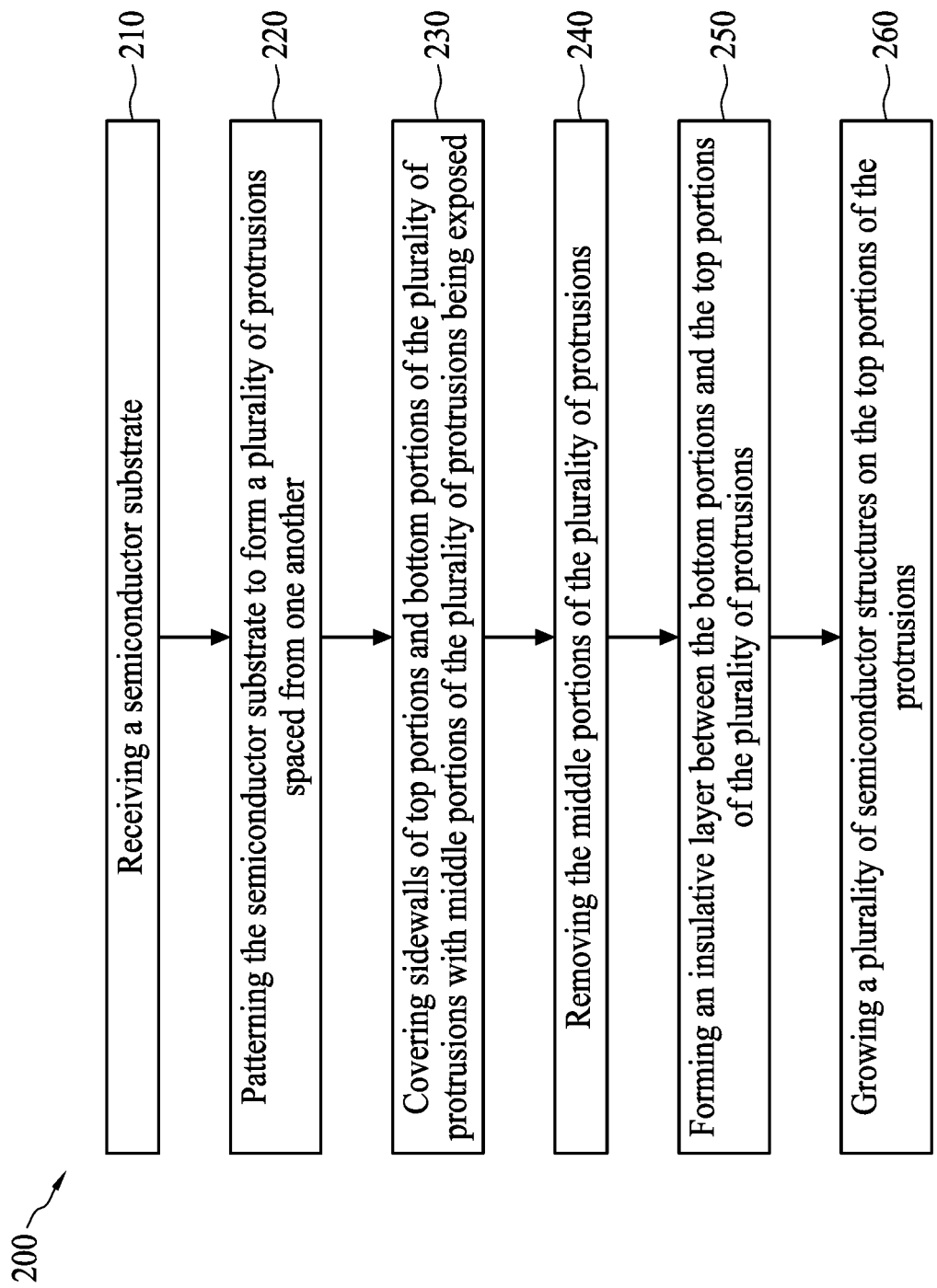
FIG. 2 is a flow chart illustrating a method for manufacturing a semiconductor device in accordance with various aspects of one or more embodiments of the present disclosure.

FIG. 2 is a flow chart illustrating a method for manufacturing a semiconductor device in accordance with various aspects of one or more embodiments of the present disclosure. The method 200 begins with operation 210 in which a semiconductor substrate is received. The method 200 continues with operation 220 in which the semiconductor substrate is patterned to form a plurality of protrusions spaced from one another. The method 200 proceeds with operation 230 in which sidewalls of top portions and bottom portions of the plurality of protrusions are covered with middle portions of the plurality of protrusions being exposed. The method 200 proceeds with operation 240 in which the middle portions of the plurality of protrusions are removed. The method 200 proceeds with operation 250 in which a supporting layer is formed between the bottom portions and the top portions of the plurality of protrusions. The method 200 proceeds with operation 260 in which a plurality of semiconductor structures are grown on the top portions of the protrusions.

The method 200 is merely an example, and is not intended to limit the present disclosure beyond what is explicitly recited in the claims. Additional operations can be provided before, during, and after the method 200, and some operations described can be replaced, eliminated, or moved around for additional embodiments of the method.

Figure 3A:
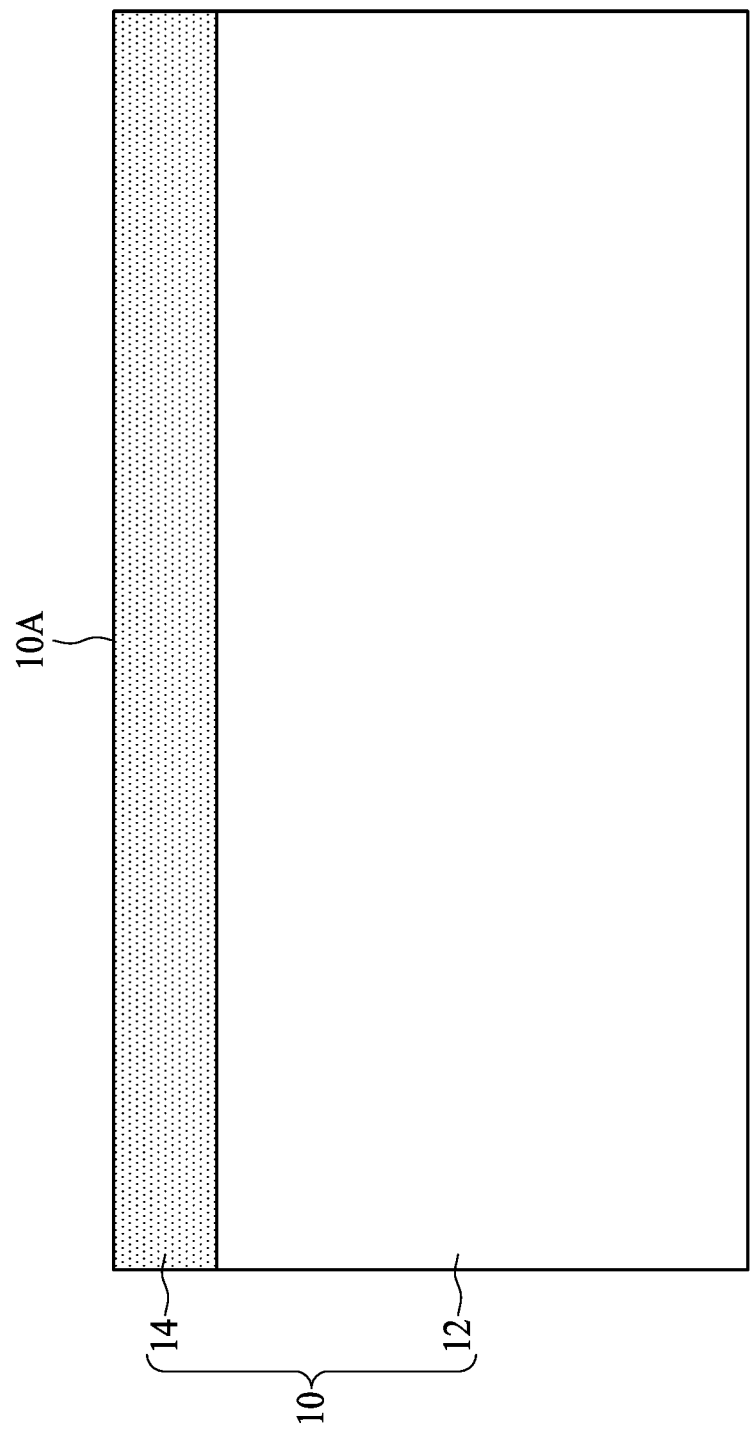
FIG. 3A, FIG. 3B, FIG. 3C, FIG. 3D, FIG. 3E, FIG. 3F, FIG. 3G, FIG. 3H, FIG. 3I, FIG. 3J, FIG. 3K, FIG. 3L and FIG. 3M are schematic views at one or more of various operations of manufacturing a semiconductor device in accordance with one or more embodiments of the present disclosure.

FIG. 3A, FIG. 3B, FIG. 3C, FIG. 3D, FIG. 3E, FIG. 3F, FIG. 3G, FIG. 3H, FIG. 3I, FIG. 3J, FIG. 3K, FIG. 3L and FIG. 3M are schematic views at one or more of various operations of manufacturing a semiconductor device in accordance with one or more embodiments of the present disclosure. As shown in FIG. 3A, a semiconductor substrate 10 is received. In some embodiments, the semiconductor substrate 10 may include a semiconductor base 12 and a semiconductor seed layer 14 over the semiconductor base 12. By way of example, the semiconductor base 12 may include a semiconductor base such as a silicon base or the like. In some embodiments, the semiconductor base 12 may be a semiconductor wafer cut from a semiconductor ingot. By way of example, the semiconductor seed layer 14 may include a semiconductor material formed on the semiconductor base 12. In some embodiments, the material for the semiconductor seed layer 14 may include silicon, germanium, silicon germanium, other semiconductor materials such as III group, IV group or V group element or compound, or the like. In some embodiments, the semiconductor seed layer 14 is epitaxially grown on the semiconductor base 12, and the thickness of the semiconductor seed layer 14 is less than its critical thickness.

Figure 3B:
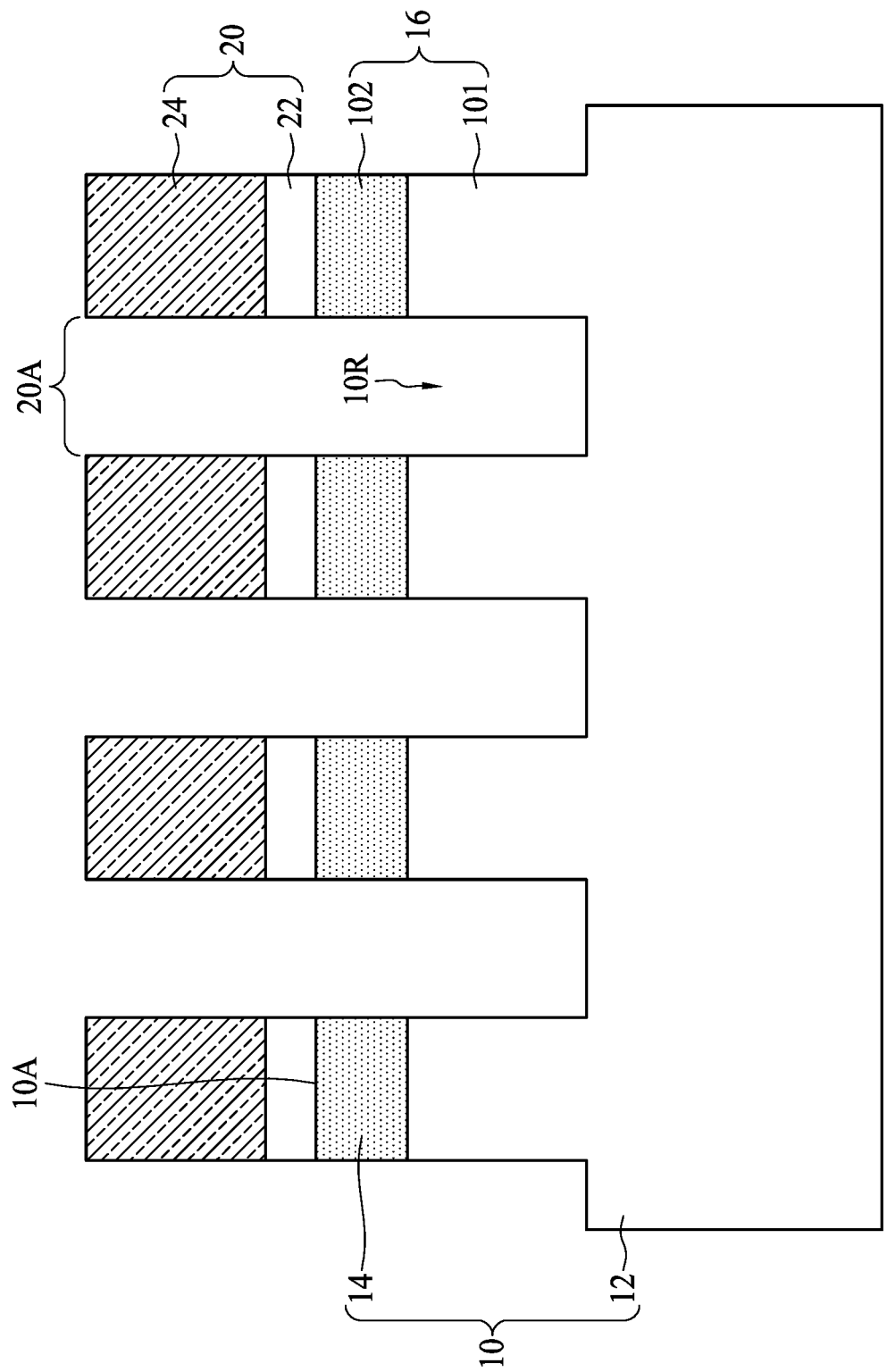

As shown in FIG. 3B, the semiconductor substrate 10 is patterned to form a plurality of recesses 10R in the semiconductor substrate 10, and a plurality of protrusions 16 spaced from one another by the recesses 10R. Each of the protrusions 16 includes a base section 101, and a seed section 102 stacked on the base section 101. In some embodiments, the base sections 101 may be portions of the semiconductor base 12, and the seed sections 102 may be portions of the semiconductor seed layer 14.

In some embodiments, the recesses 10R and the protrusions 16 may be formed by photolithography and etching techniques. In some embodiments, a patterned mask layer 20 is formed over a surface 10A of the semiconductor substrate 10 as a hark mask. The patterned mask layer 20 includes a plurality of openings 20A partially exposing the surface 10A of the semiconductor substrate 10. In some embodiments, the patterned mask layer 20 may be a single-layered mask or a multi-layered mask. In some embodiments, the patterned mask layer 20 may include a pad layer 22 and a hard mask layer 24 stacked on the pad layer 22. By way of example, the pad layer 22 may include a pad oxide layer such as a silicon oxide layer, and configured to enhance adhesion between the hard mask layer 24 and the semiconductor substrate 10. By way of example, the hard mask layer 24 may include a nitride layer such as a silicon nitride layer. The portion of the semiconductor substrate 10 may be then removed e.g. by etching through the openings 20A of the patterned mask layer 20 to form the recesses 10R in the semiconductor substrate 10 and the protrusions 16 spaced from one another by the recesses 10R. Each of the seed sections 102 is between the respective base section 101 and the patterned mask layer 20.

Figure 3C:
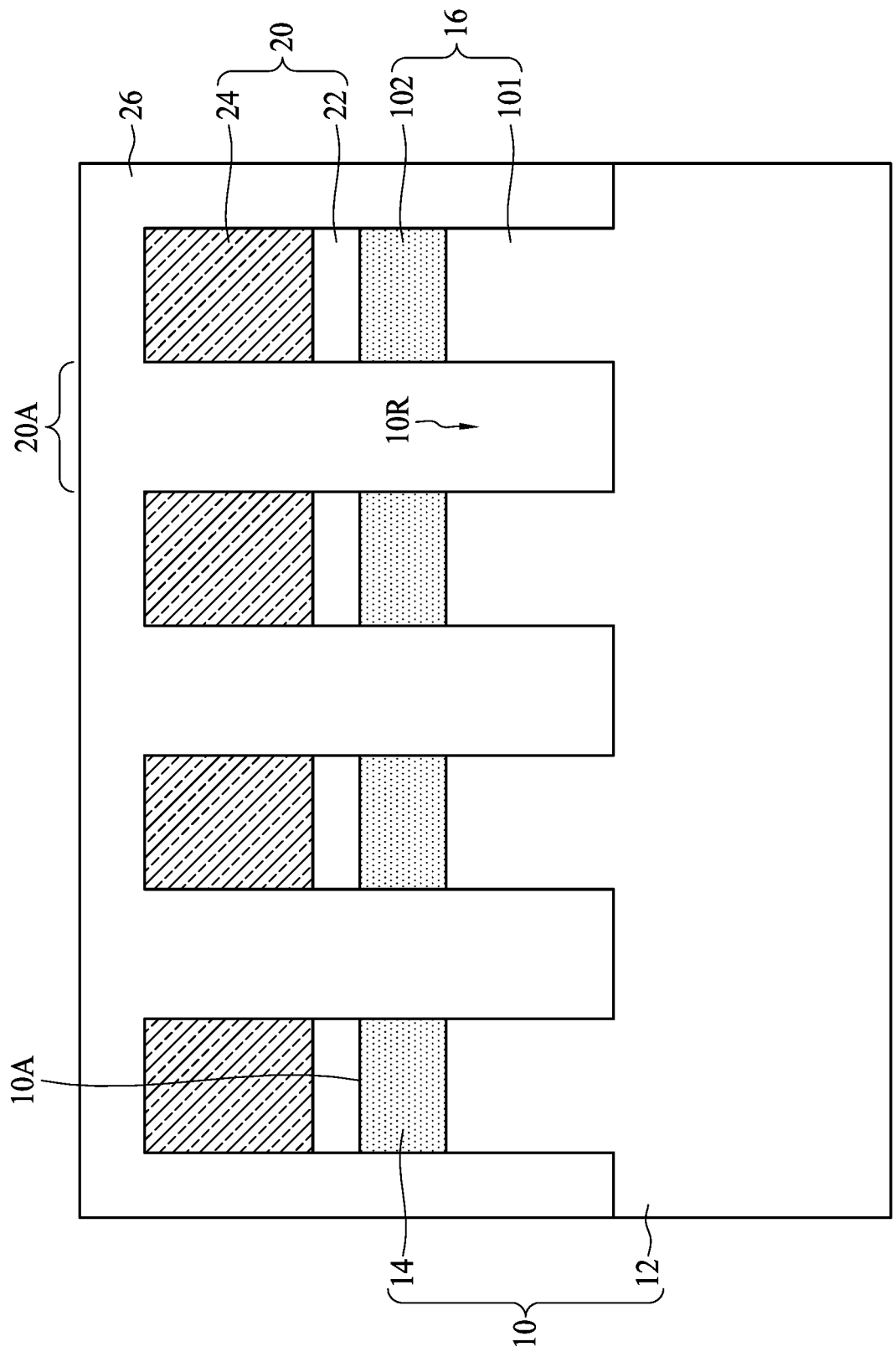

In some embodiments, a plurality of first insulative structures are formed in the recesses 10R respectively. In some embodiments, the first insulative structures may be formed by the following operations, but are not limited thereto. As shown in FIG. 3C, a first insulative layer 26 is formed in the plurality of recesses 10R. In some embodiments, the first insulative layer 26 may be formed over the patterned mask layer 20 and filled in the recesses 10R and the openings 20A. In some embodiments, the material for the first insulative layer 26 may include oxide compound such as silicon oxide or other suitable insulative or dielectric materials. In some embodiments, a liner insulative layer (not shown) can be formed over the patterned mask layer 20 and in the recesses 10R prior to formation of the first insulative layer 26, but is not limited thereto.

Figure 3D:
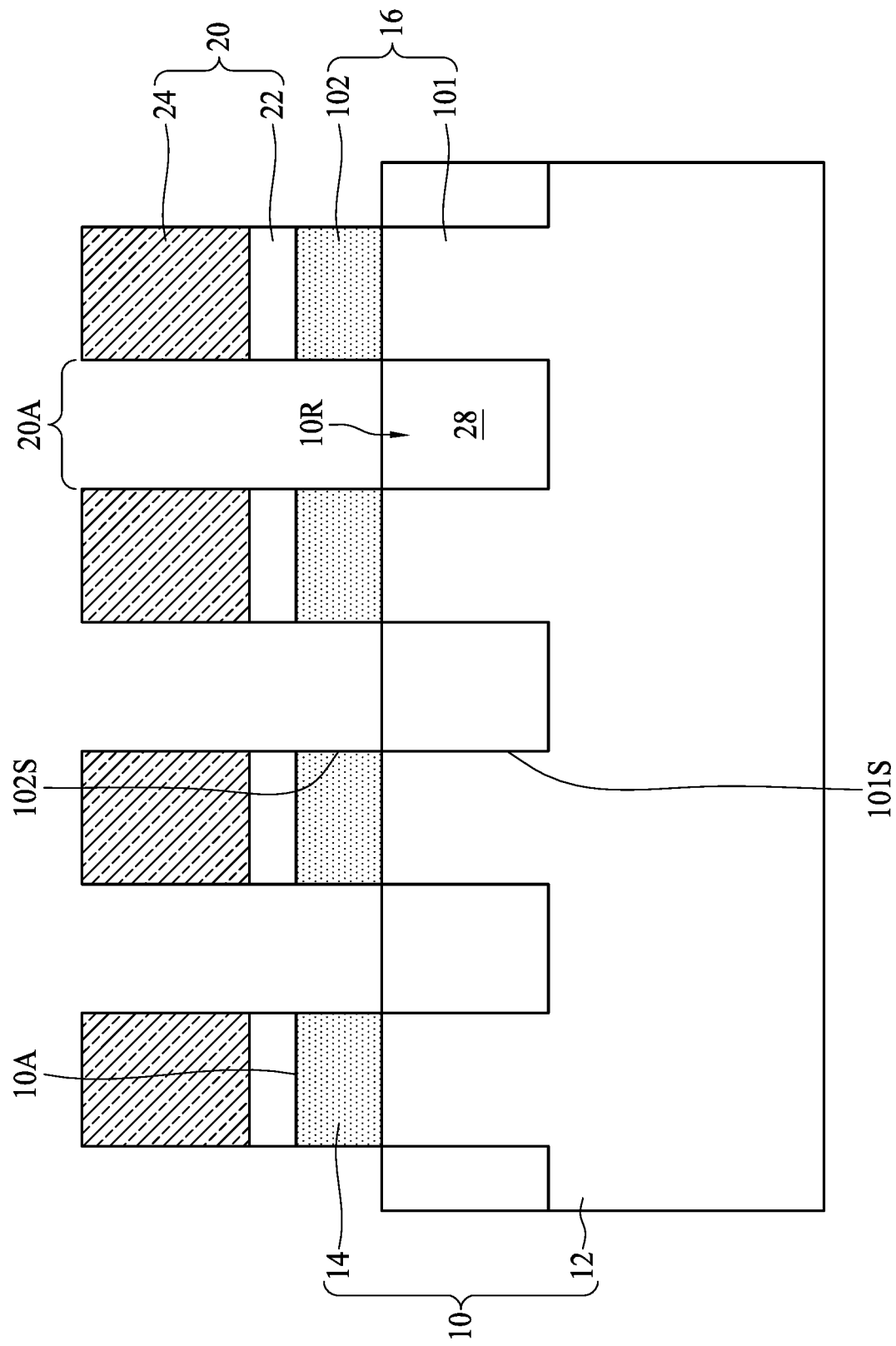

As shown in FIG. 3D, a planarization operation such as a chemical mechanical polishing (CMP), grinding or the like may be performed to remove the first insulative layer 26 outside the openings 20A in some embodiments. In some embodiments, the first insulative layer 26 may be partially removed to form the first insulative structures 28 in the recesses 10R respectively. In some embodiments, the first insulative structures 28 cover sidewalls 101S of the base sections 101 and expose sidewalls 102S of the seed sections 102.

Figure 3E:
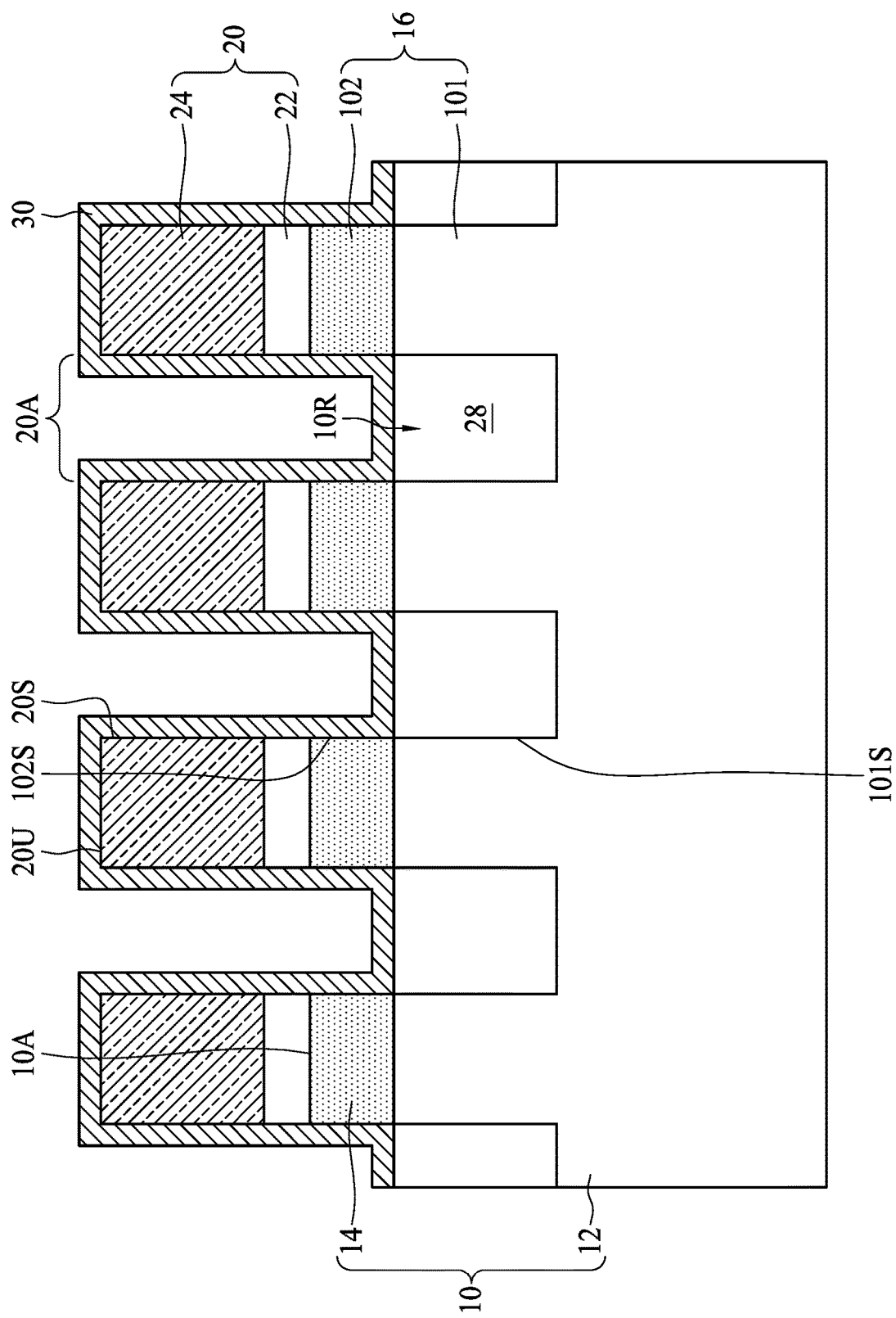

In some embodiments, a plurality of spacers covering the sidewalls 102S of the seed sections 102 are formed. In some embodiments, the spacers may be formed by the following operations, but are not limited thereto. As shown in FIG. 3E, a liner spacer layer 30 may be formed to cover an upper surface 20U and sidewalls 20S of the patterned mask layer 20 as well as the sidewalls 102S of the seed sections 102 and the first insulative structures 28. In some embodiments, the material for the liner spacer layer 30 may include nitride compound such as silicon nitride or the like.

Figure 3F:
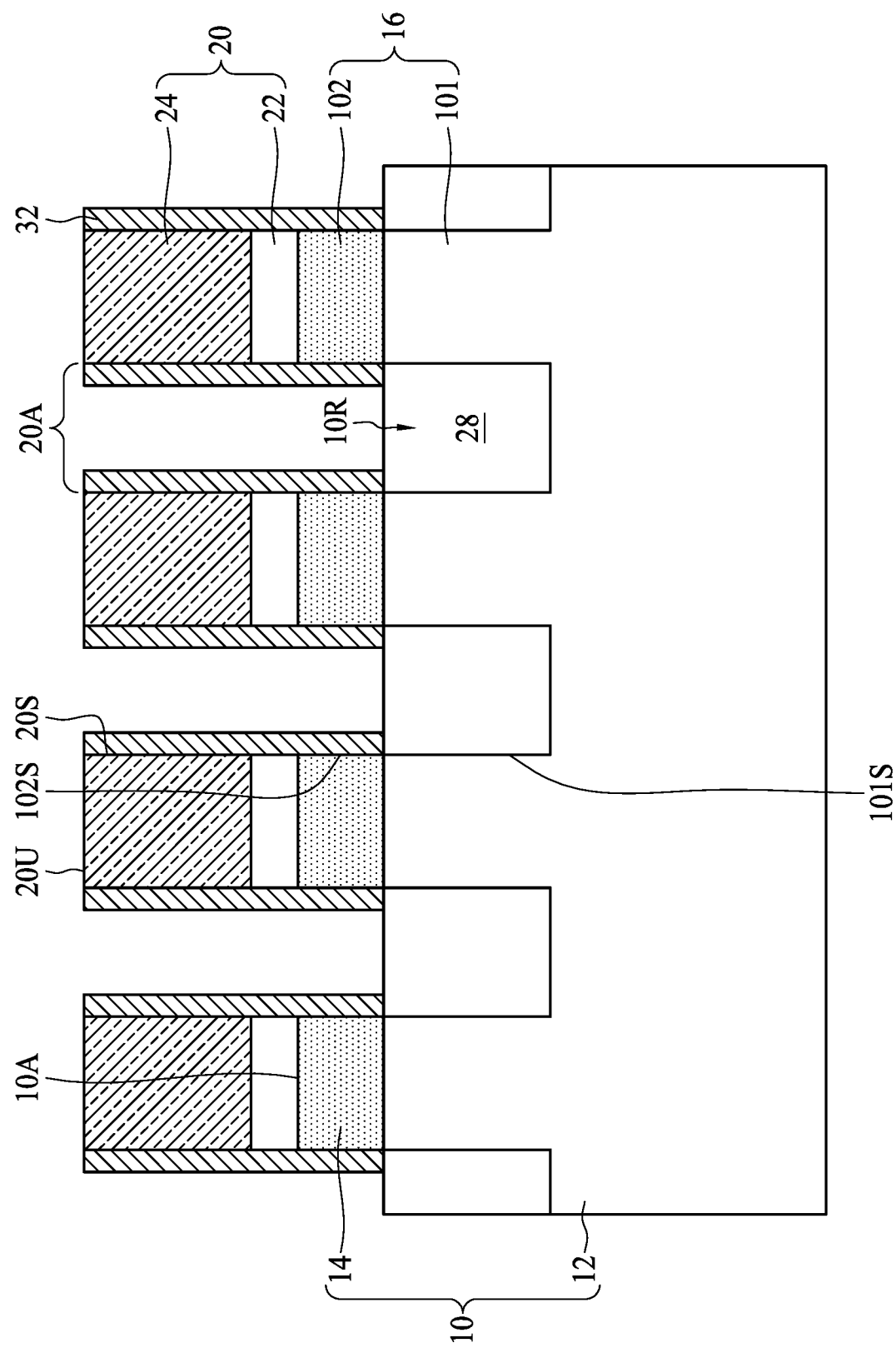

As shown in FIG. 3F, the liner spacer layer 30 over the upper surface 20U of the patterned mask layer 20 and the first insulative structures 28 may be removed, while the liner spacer layer 30 covering the sidewalls 20S of the patterned mask layer 20 and the sidewalls 102S of the seed sections 102 are remained. In some embodiments, the liner spacer layer 30 may be removed by an anisotropic etching such as a plasma etching, but is not limited thereto. Accordingly, the spacers 32 covering the sidewalls 102S of the seed sections 102 may be formed. In some embodiments, the spacers 32 may further cover the sidewalls 20S of the patterned mask layer 20.

Figure 3G:
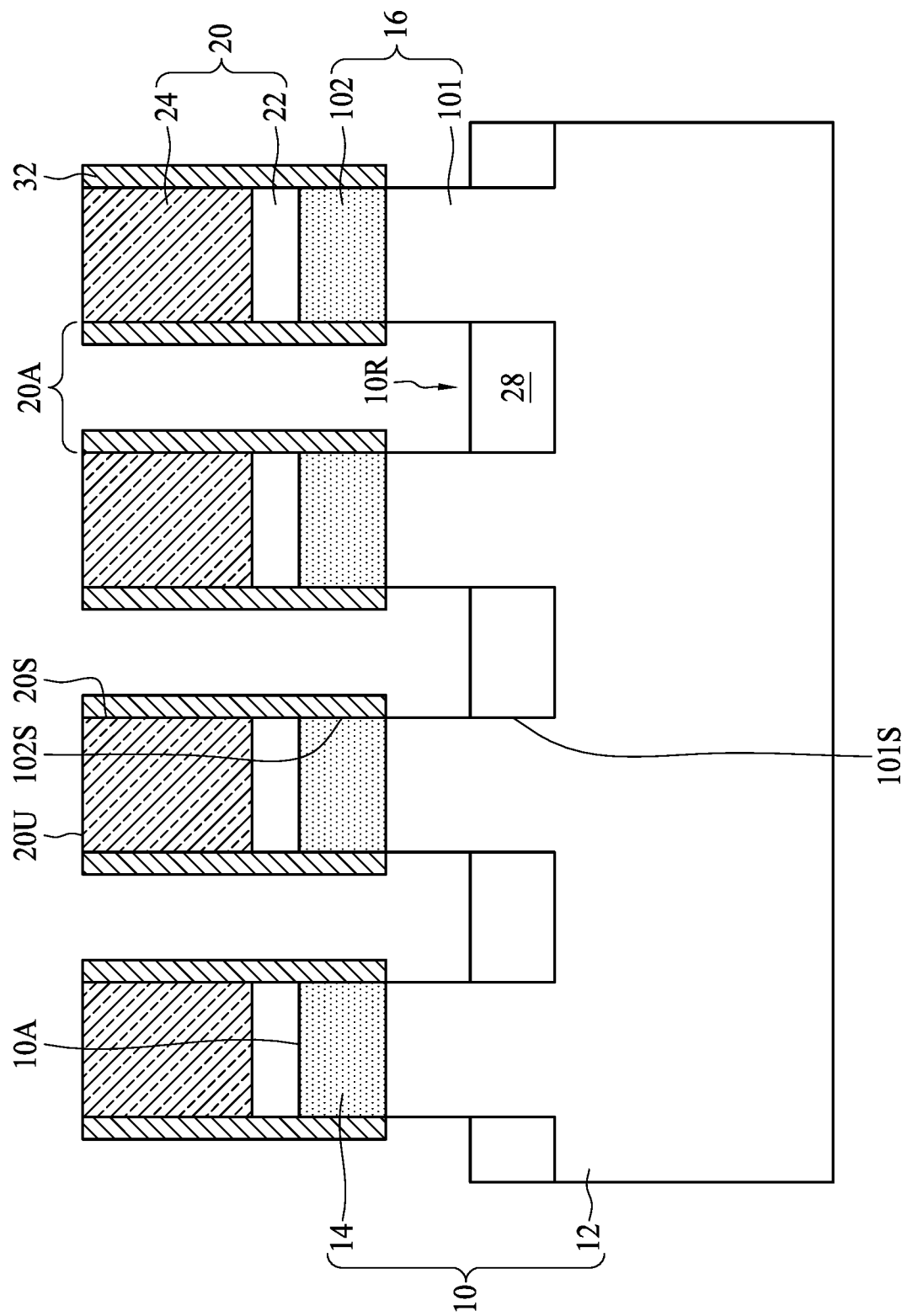

As shown in FIG. 3G, each of the first insulative structures 28 is partially removed to at least partially expose the sidewalls 101S of the base sections 101. In some embodiments, the first insulative structures 28 may be partially removed by an anisotropic etching such as a plasma etching, but is not limited thereto.

Figure 3H:
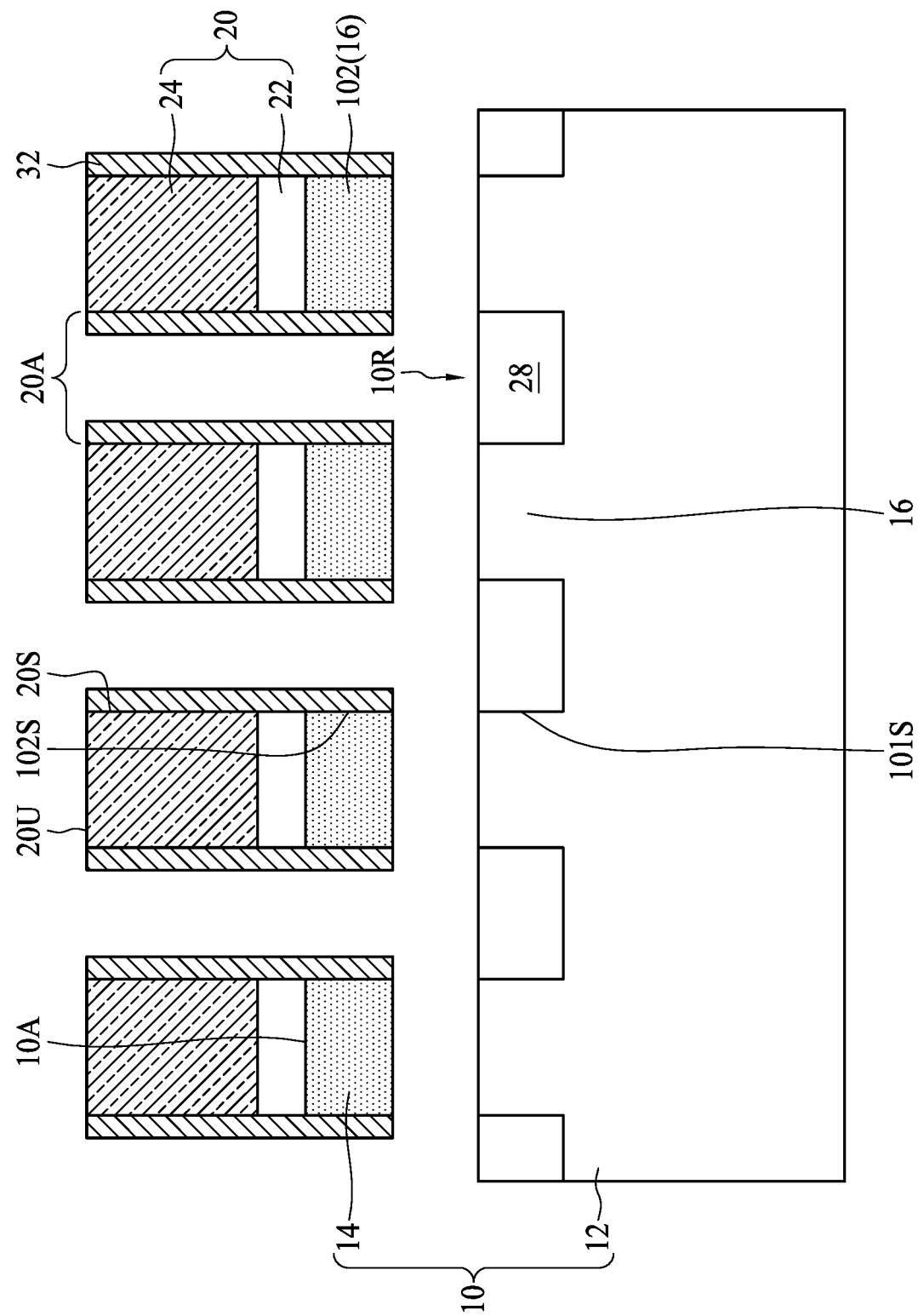
Figure 3I:
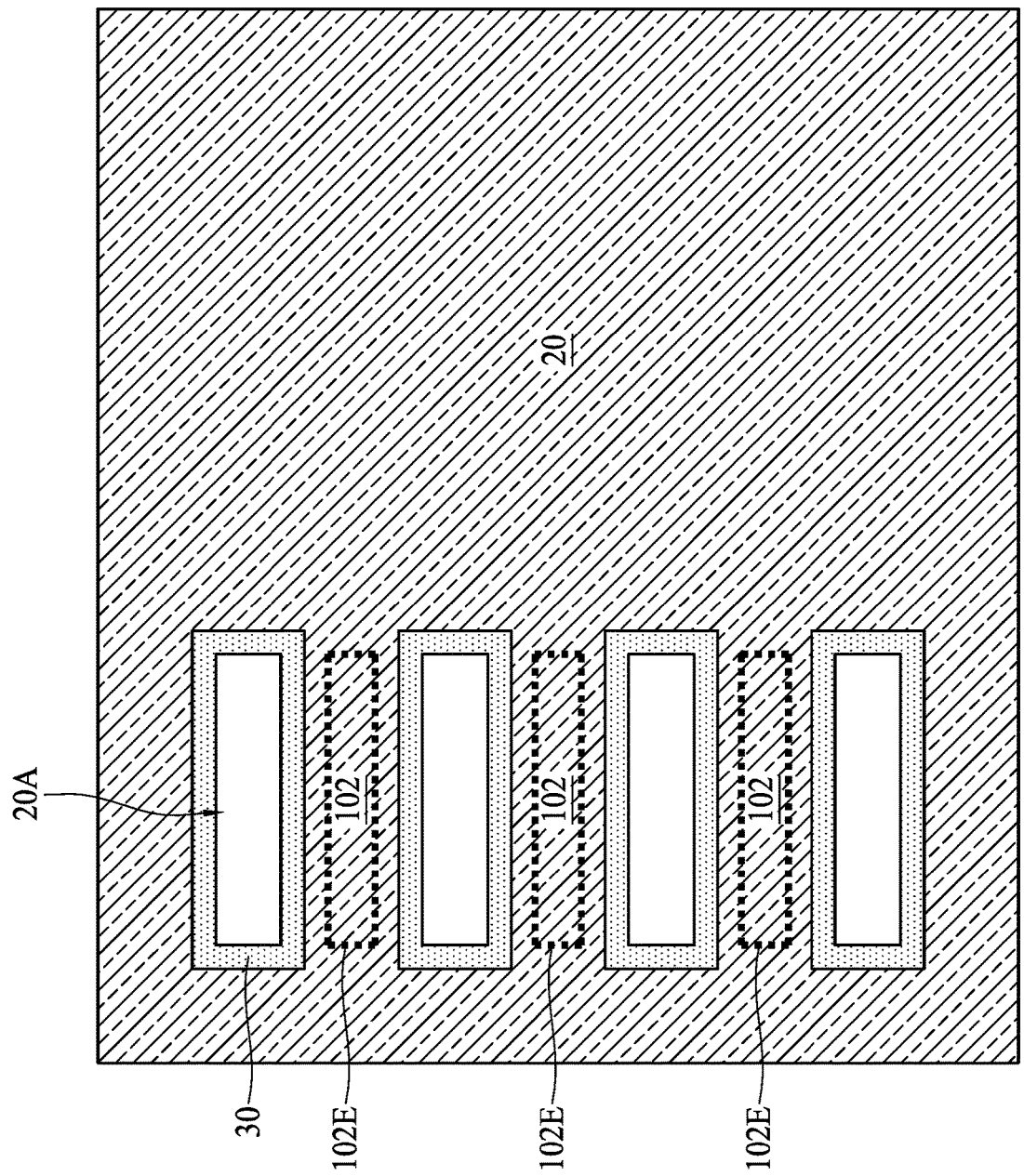

As shown in FIG. 3H and FIG. 3I, the base sections 101 exposed from the first insulative structures 28 are removed. In some embodiments, the seed sections 102 of the protrusions 16 are suspended from the semiconductor base 12, but two ends 102E of the seed section 102 are configured as anchor portions connected to the semiconductor substrate 10. In some embodiments, the first insulative structures 28 may be removed by etching such as lateral etching. In some embodiments, the base sections 101 exposed from the first insulative structures 28 may be oxidized before etching the base sections 101 exposed from the first insulative structures 28. The oxidized base sections 101 may become semiconductor oxide compound such as silicon oxide, and thus may have different etching rate than the seed sections 102 and the other portion of the semiconductor substrate 10 with respect to an etchant for etching the base sections 101. By way of example, when the seed section 102 is silicon and the exposed base section 101 is silicon oxide, an etchant solution such as ammonium hydroxide ($NH_4OH$) solution, tetramethylammonium hydroxide (TMAH) solution, potassium hydroxide (KOH) solution or the like can be used to wet etch the exposed base section 101. In some embodiments, the etching selectivity between the base section 101 and the seed section 102 with respect to the etchant solution may be larger than about 10. In some embodiments, the exposed base section 101 may be removed by dry etching. The etchant for dry etching the base section 101 may include, but is not limited to, hydrochloride (HCl), interhalogen compound such as $ClF_3$ or the like, halogen such as $F_2$, halogen compound such as $XeF_2$, $SF_6$, $NF_3$ or the like.

This etching rate difference may alleviate damages to the seed sections 102 and the semiconductor substrate 10 while etching the base sections 101. After the base sections 101 have been removed, the remaining portions of protrusions 16 are protruding from the surface of the semiconductor base 12 and aligned to the seed sections 102.

Figure 3J:
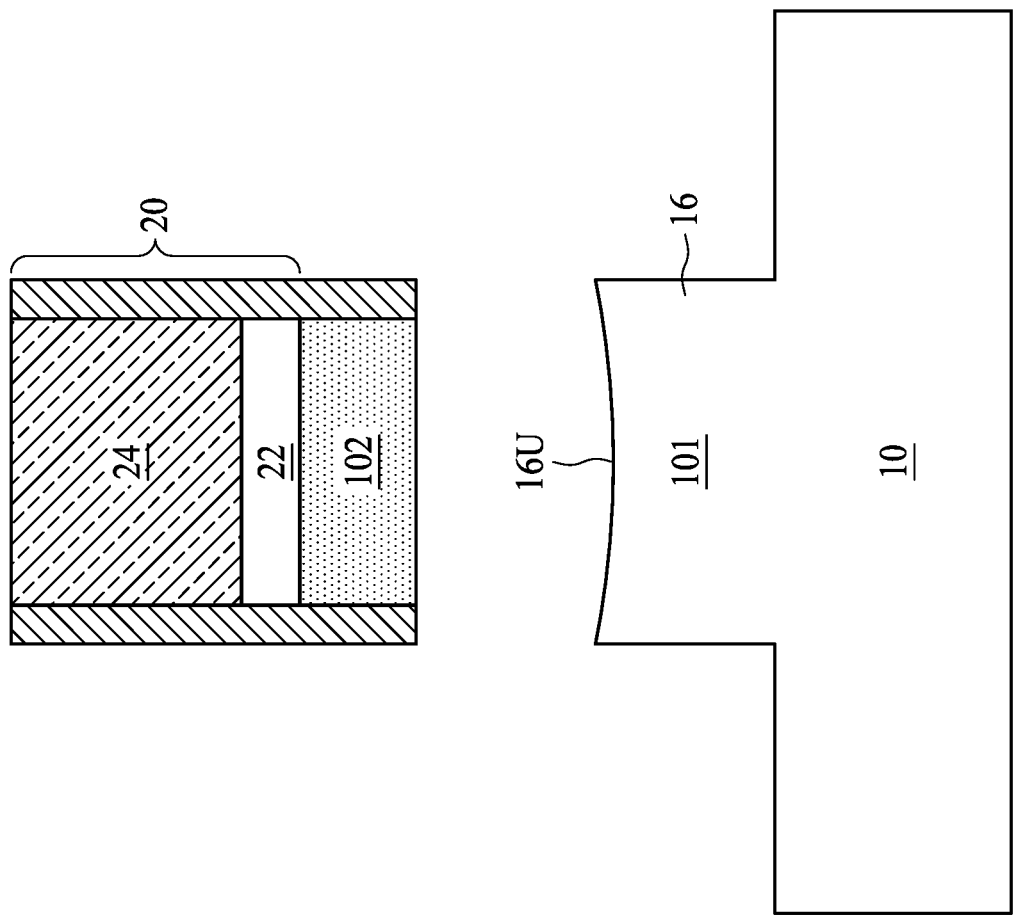

FIG. 3J is an enlarged view of the protrusions 16 after the base sections 101 are etched in some embodiments of the present disclosure. As shown in FIG. 3J, the upper surface 16U of some protrusions 16 may be a non-flat surface such as a concave surface, a convex surface or a combination thereof after the base sections 101 are etched. The non-flat upper surface 16U may be generated due to the non-uniformity in etching the base sections 101.

Figure 3K:
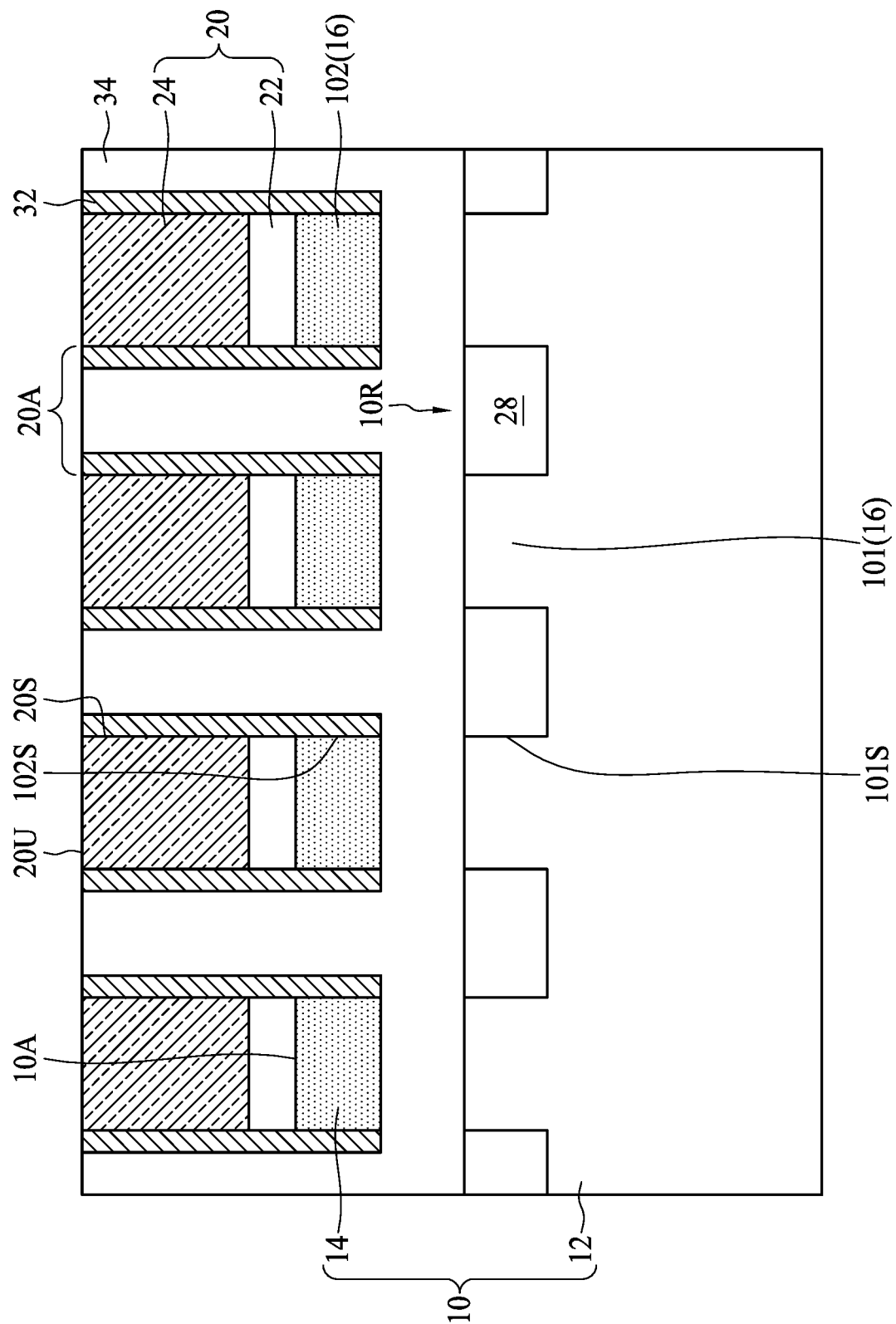

As shown in FIG. 3K, a plurality of second insulative structures 34 are formed in the recesses 10R respectively. In some embodiments, the second insulative structures 34 are extended laterally to be disposed under the seed sections 102, and between the protrusions 16 of the semiconductor base 12 and the seed sections 102. The second insulative structures 34 may isolate the protrusions 16 of the semiconductor base 12 from the seed sections 102 so that the protrusions 16 and the seed sections 102 are not in contact with each other. In some embodiments, the material for the second insulative structures 34 may be the same as that of the first insulative structures 28, but is not limited thereto. Example of the material for the second insulative structures 34 may include an oxide compound such as silicon oxide, but is not limited thereto.

Figure 3L:
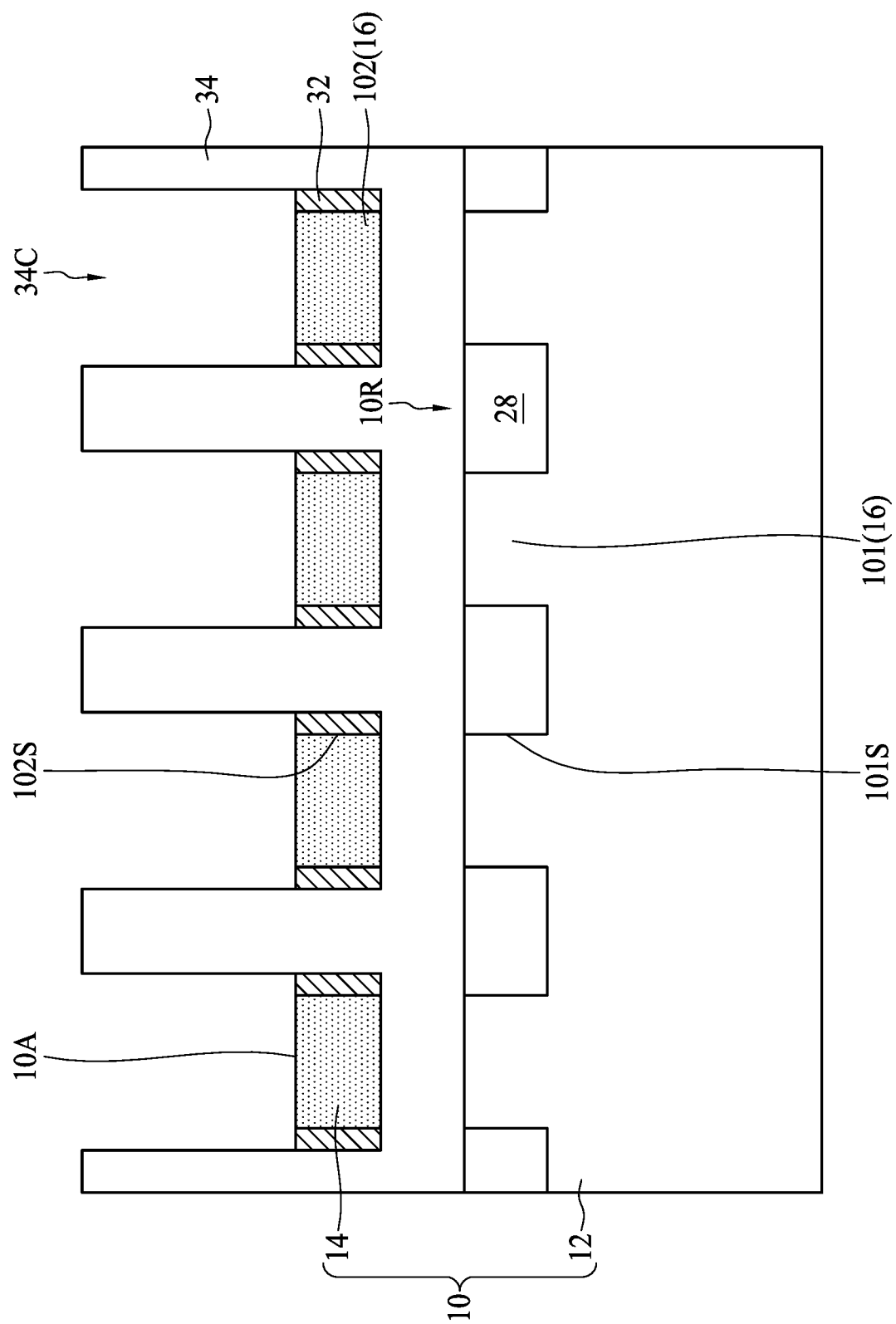

As shown in FIG. 3L, the patterned mask layer 20 is removed to expose the seed sections 102 and the spacers 32. In some embodiments, the seed sections 102 and the spacers 32 may be laterally surrounded by the second insulative structures 34, while upper surfaces of the seed sections 102 and the spacers 32 are exposed. In some embodiments, the second insulative structures 34 are protruded out upwardly from the seed sections 102 and the spacers 32 after the patterned mask layer 20 is removed so as to form a plurality of cavities 34C over the seed sections 102 and the spacers 32. In some embodiments, the second insulative structures 34 may be partially removed to adjust the depth of the cavity 34C. In some alternative embodiments, the portion of the second insulative structures 34 may be removed such as by CMP or grinding such that the second insulative structures 34, the spacers 32 and the second seed sections 102 may be substantially coplanar.

Figure 3M:
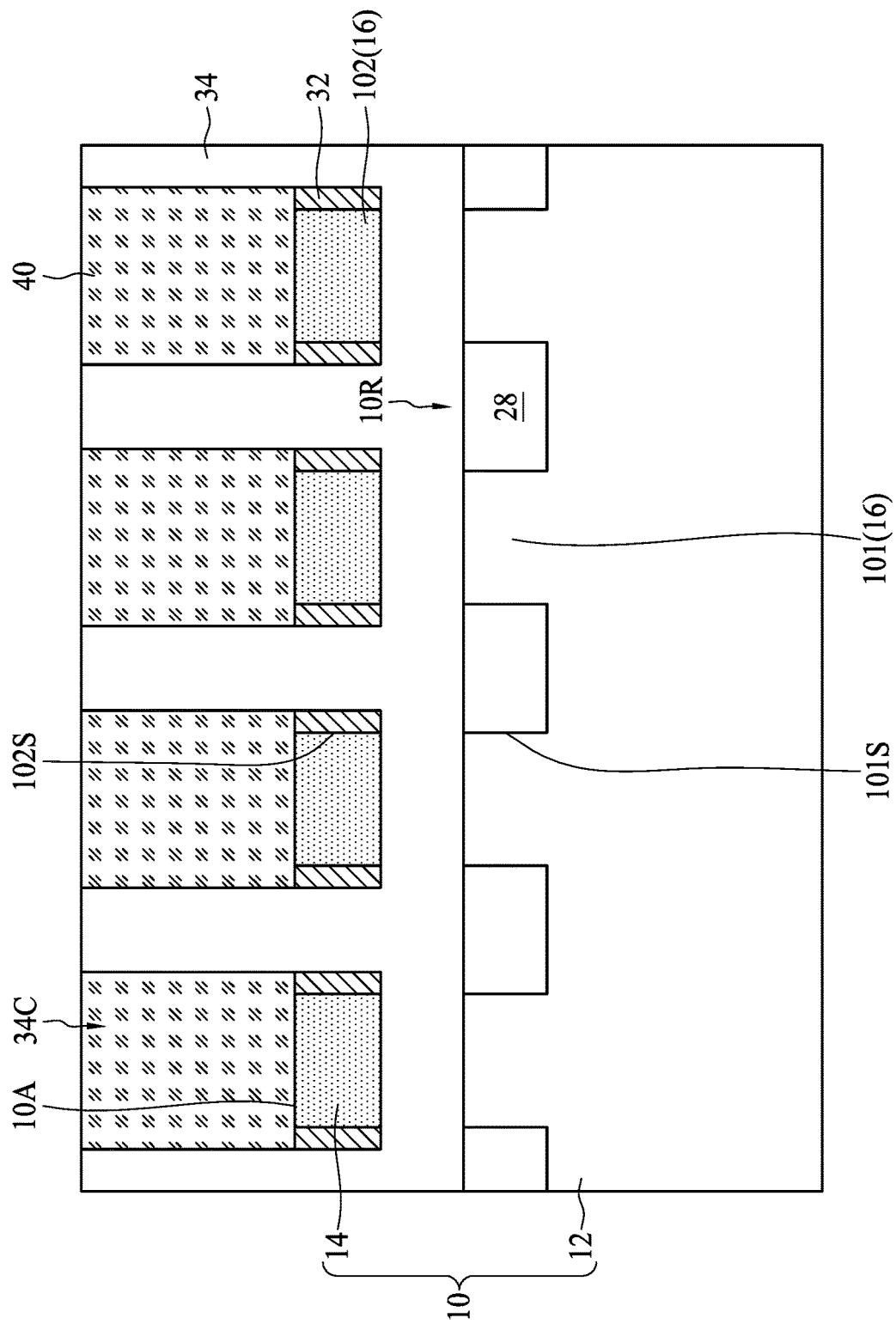

As shown in FIG. 3M, a plurality of first semiconductor structures 40 are epitaxially grown over the seed sections 102 subsequent to formation of the second insulative structures 34 to form a semiconductor device 1 of some embodiments of the present disclosure. The seed section 102 and the first semiconductor structure 40 stacked thereon form a stacked semiconductor structure. In some embodiments, the material for the first semiconductor structures 40 may be the same as or different from the seed sections 102. The first semiconductor structure 40 and the seed section 20 can together form a channel of a transistor device. Example of the material for the first semiconductor structures 40 may include, but is not limited to, silicon, germanium, silicon germanium, other semiconductor materials such as III group, IV group or V group element or compound, or the like. In some embodiments, the seed section 102 is configured as a seed layer to epitaxially grow the first semiconductor structure 40. The thickness of seed section 102 is less than the critical thickness of the material for the seed section 102, i.e., the seed section 102 is in a substantially defect-free state. Accordingly, defects will be inhibited when the first semiconductor structure 40 is epitaxially grown on the seed section 102 in a substantially defect-free state. In some embodiments, the seed section 102 is also configured as a medium for stain transfer. The thickness of the first semiconductor structure 40 is not limited by its critical thickness, and the first semiconductor structure 40 may be thicken without or with fewer defects since the strain energy achieves saturation. The first semiconductor structure 40 may be configured as an inverse virtual substrate. The first semiconductor structures 40 epitaxially grown on the seed section 102 can be strained, and thus device performance can be enhanced.

Figure 4:
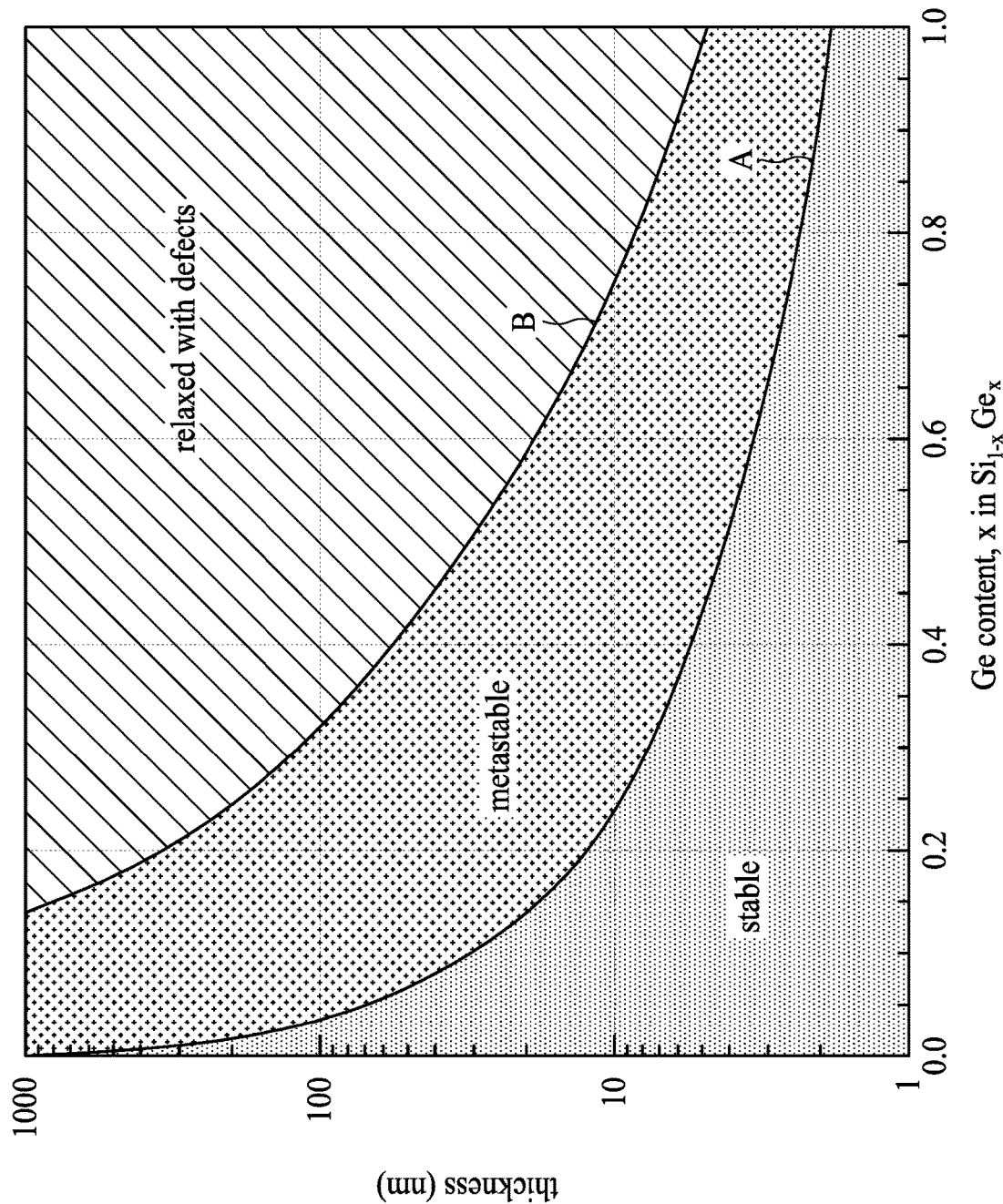
FIG. 4 is a graph illustrating a relation between critical thickness and silicon germanium in different compositions.

In some embodiments of the present disclosure, a semiconductor material is grown on a semiconductor seed material, and the semiconductor material and the semiconductor seed material have mismatched lattice constants. The term "critical thickness" is defined as a maximum stable thickness of a strained semiconductor material substantially without defects such as misfit dislocations and threading dislocations. FIG. 4 is a graph illustrating a relation between critical thickness and silicon germanium in different compositions. The vertical axis is the thickness. The horizontal axis is the composition of germanium in a silicon germanium material ($Si_{1-x}Ge_x$, where x=0-1). As shown in FIG. 4, two curves A and B define a stable region, a metastable region and a relaxed-with-defects region for silicon germanium material having different compositions. Above curve B are silicon germanium materials that are in the relaxed-with-defects condition. Below curve A are silicon germanium materials that are in the stable condition (i.e., substantially defect-free and in a "fully-strained" condition). The region between the two curves A and B defines the region where silicon germanium materials are in the metastable condition. The silicon germanium materials in the metastable condition are not stable, but can still be fully strained and substantially defect-free if grown under the right conditions. In some embodiments of the present disclosure, the critical thickness of a semiconductor material is defined as the thickness when the semiconductor material is in the stable condition or in the metastable condition. In the stable condition or in the metastable condition, the semiconductor material is substantially defect-free, and thus another semiconductor material having mismatched lattice constant grown on the defect-free semiconductor material can also be substantially defect-free, even when the thickness of newly grown semiconductor material exceeds its theoretical critical thickness.

Refer to FIG. 3M. In some examples of the present disclosure, if the material for the seed section 102 is silicon having a thickness less than 3 nm, the thickness of the first semiconductor structure 40 such as a germanium layer epitaxially grown on the seed section 102 can exceeds its theoretical critical thickness without defects. In some other examples of the present disclosure, if the material for the seed section 102 is $Si_{0.5}Ge_{0.5}$ having a thickness less than 10 nm, the thickness of the first semiconductor structure 40 such as a germanium layer epitaxially grown on the seed section 102 can exceeds its theoretical critical thickness without defects.

The semiconductor device and its manufacturing method of the present disclosure are not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 5A:
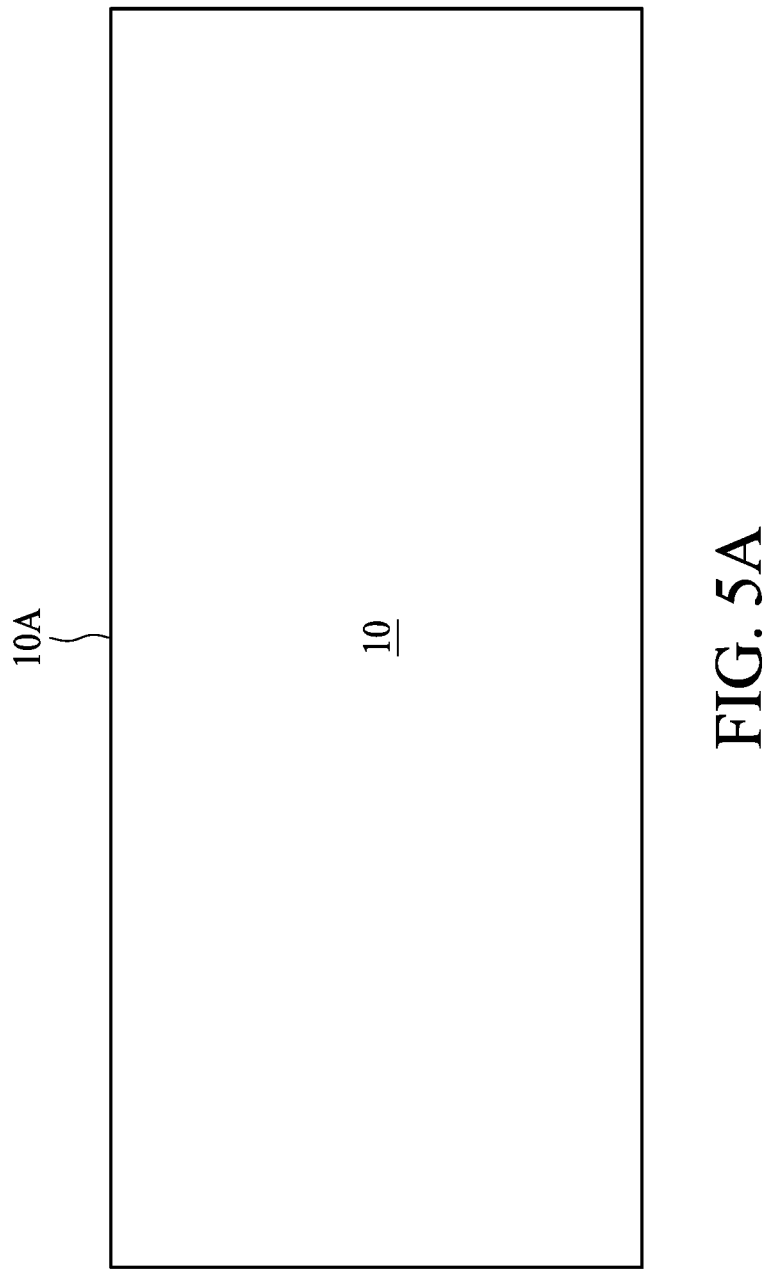
FIG. 5A, FIG. 5B and FIG. 5C are schematic views at one or more of various operations of manufacturing a semiconductor device in accordance with one or more embodiments of the present disclosure.
Figure 5B:
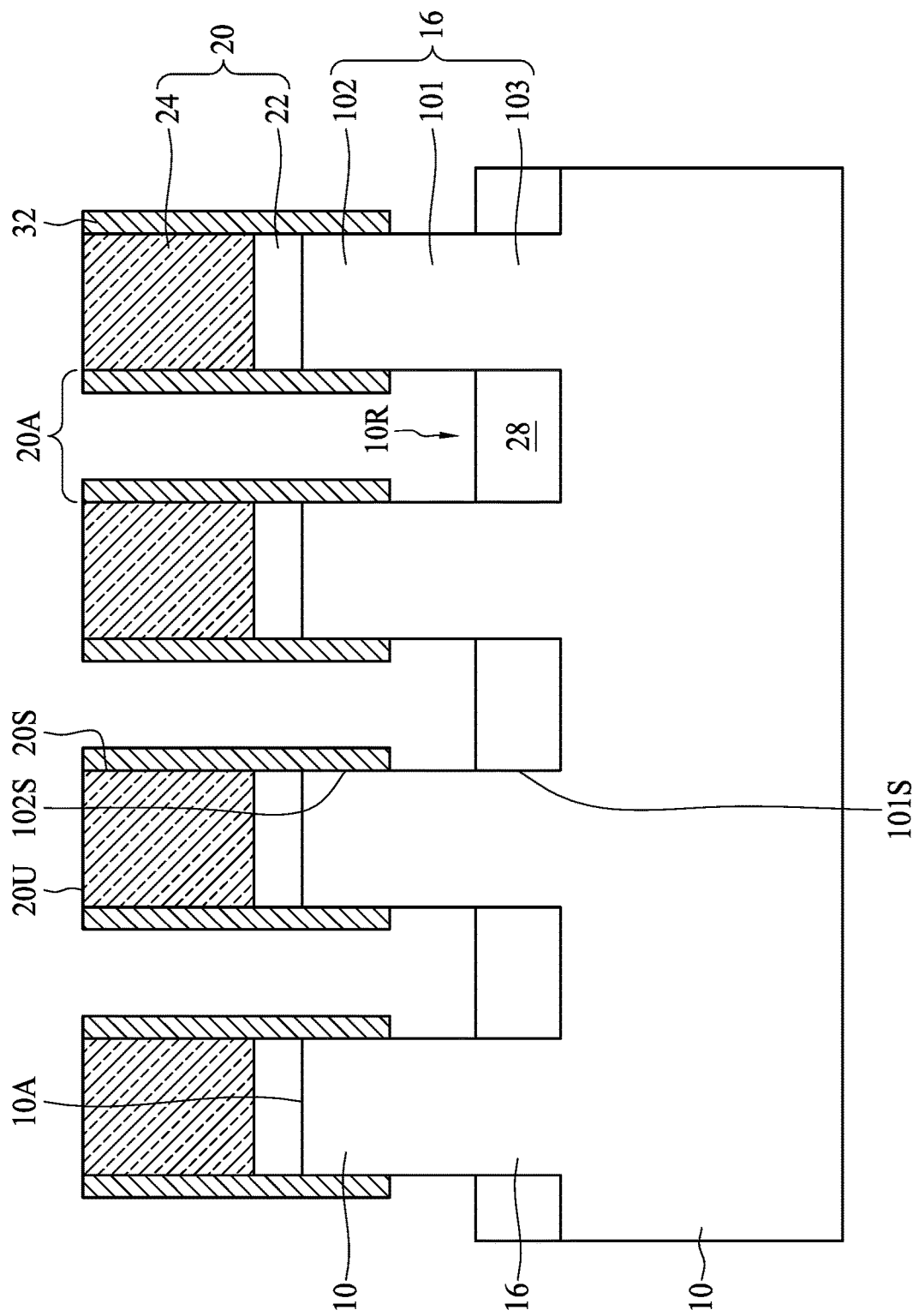
Figure 5C:
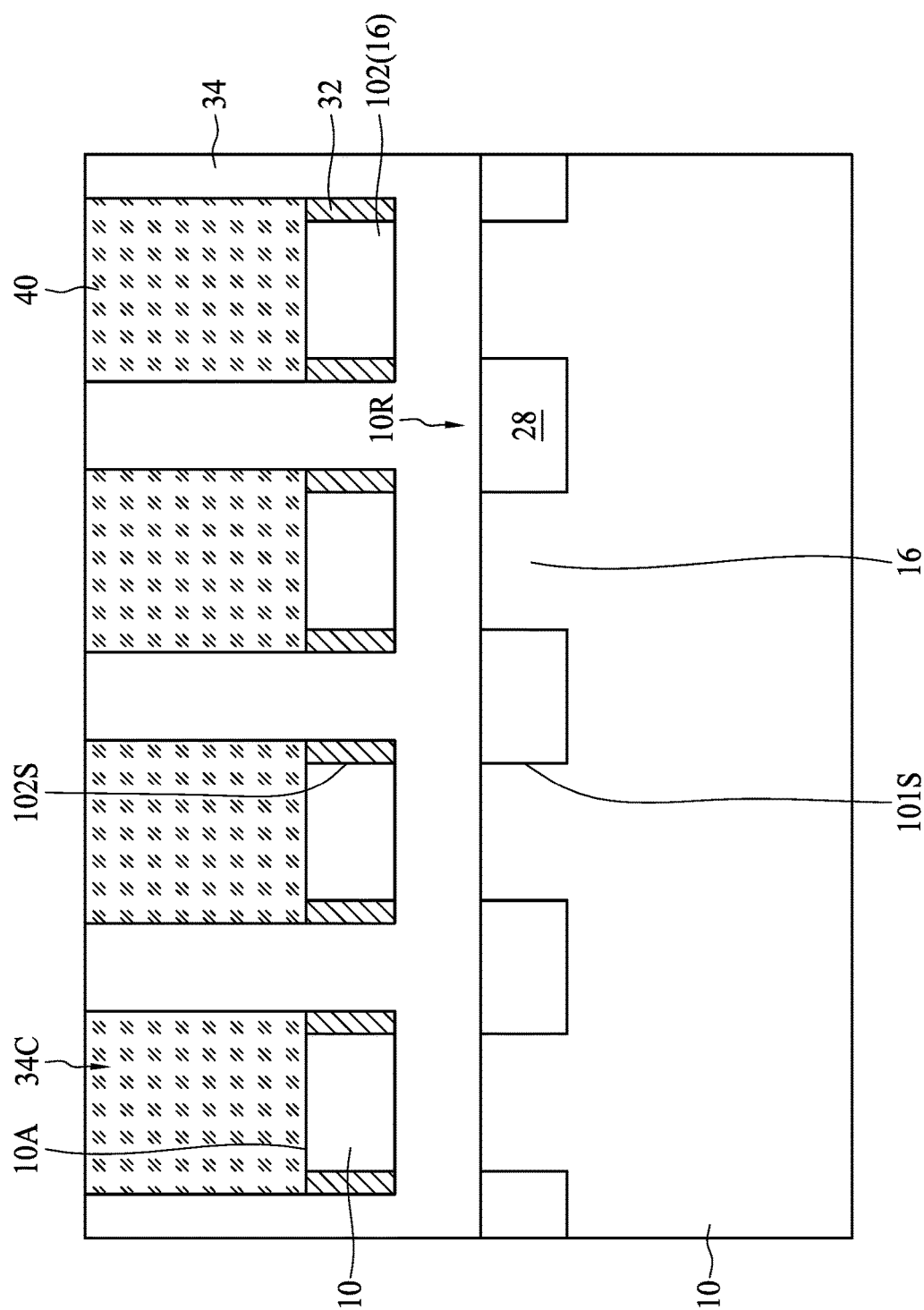

FIG. 5A, FIG. 5B and FIG. 5C are schematic views at one or more of various operations of manufacturing a semiconductor device in accordance with one or more embodiments of the present disclosure. As shown in FIG. 5A, a semiconductor substrate 10 is received. In contrast to the semiconductor device 1, the semiconductor substrate 10 is a bulk semiconductor substrate. Successive operations similar to that described in FIGS. 3A-3F can be performed to form a plurality of protrusions 16. The base sections 101 may be some portions of the bulk semiconductor substrate, and the seed sections 102 may be some other portions of the bulk semiconductor substrate. In some embodiments, the protrusions 16 may include a bottom portion 103, a middle portion (e.g., the base section 101) and a top portion (e.g., the seed section 102) stacked on one another as shown in FIG. 5B. The sidewalls of the bottom portions 103 may be covered by the first insulative structures 28, and the sidewalls of the top portions (seed section 102) may be covered by the spacers 32. The first insulative structures 28 are partially removed to at least partially expose the sidewalls 101S of the base sections 101 e.g., the middle portions. Successive operations similar to that described in FIGS. 3H-3K can be performed. As shown in FIG. 5C, plurality of first semiconductor structures 40 are epitaxially grown over the seed sections 102 subsequent to formation of the second insulative structures 34 to form a semiconductor device 2 of some embodiments of the present disclosure. In some embodiments, the material for the first semiconductor structures 40 may be the same as or different from the seed sections 102. Example of the material for the first semiconductor structures 40 may include, but is not limited to, silicon, germanium, silicon germanium, other semiconductor materials such as III group, IV group or V group element or compound, or the like. In some embodiments, the seed section 102 is configured as a seed layer to epitaxially grow the first semiconductor structure 40. The thickness of seed section 102 is less than the critical thickness of the material for the seed section 102, i.e., the seed section 102 is in a substantially defect-free state.

Figure 6A:
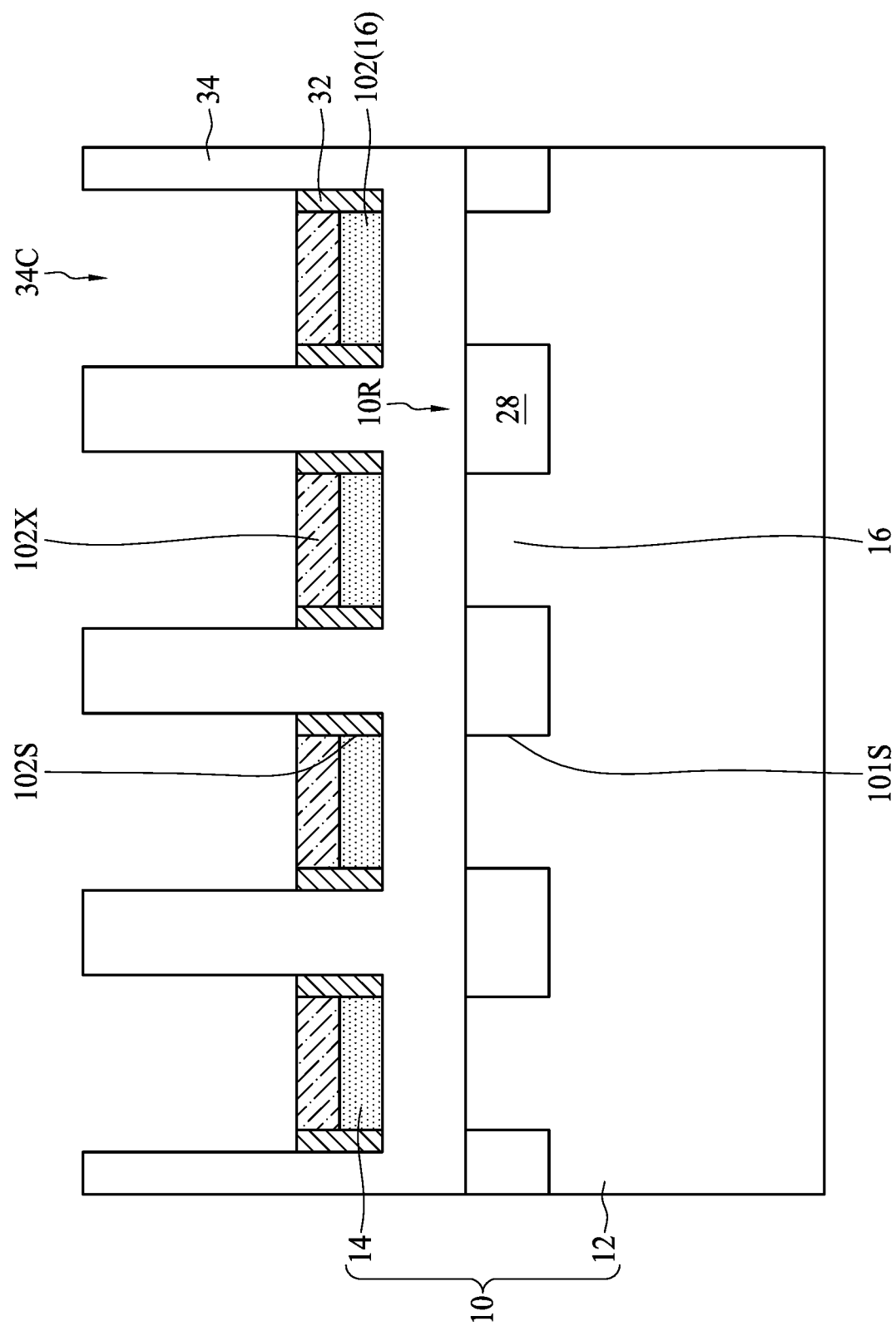
FIG. 6A, FIG. 6B and FIG. 6C are schematic views at one or more of various operations of manufacturing a semiconductor device in accordance with one or more embodiments of the present disclosure.
Figure 6B:
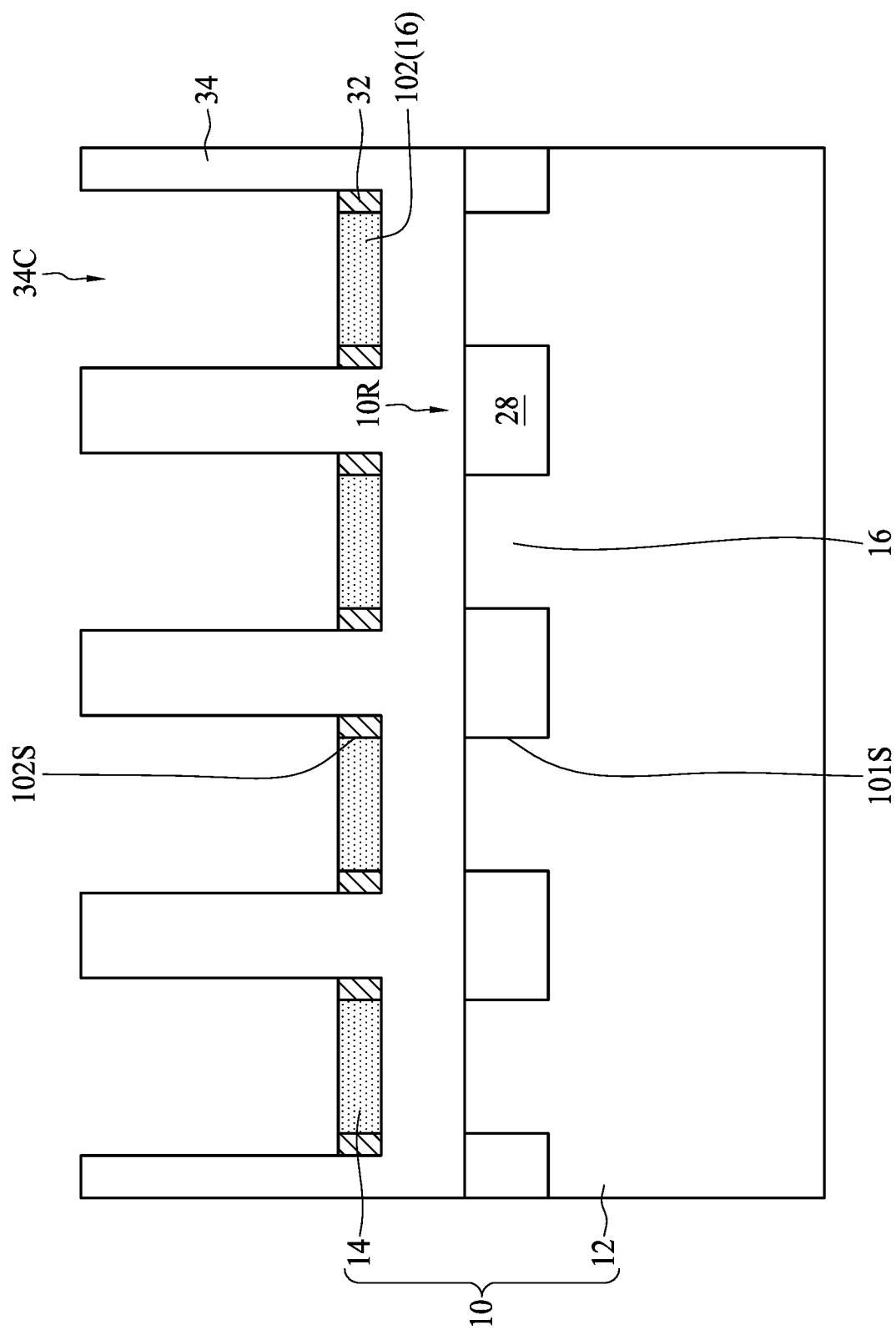
Figure 6C:
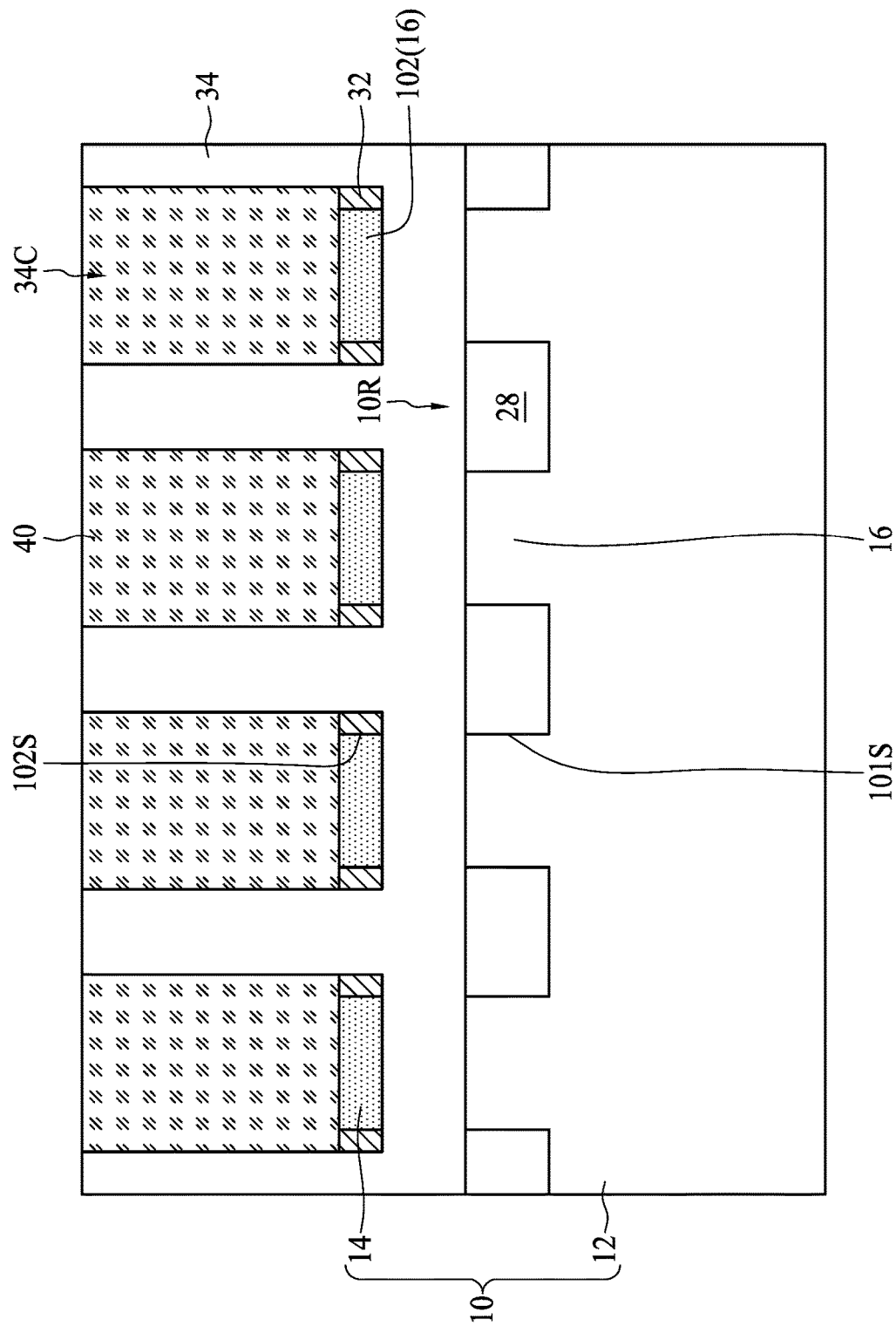

FIG. 6A, FIG. 6B and FIG. 6C are schematic views at one or more of various operations of manufacturing a semiconductor device in accordance with one or more embodiments of the present disclosure. In some embodiments, the operations illustrated in FIG. 6A can be performed subsequent to the operation illustrated in FIG. 3J. As shown in FIG. 6A, each of the seed sections 102 may be partially oxidized to form an oxidized portion 102X in each of the seed sections 102. For example, the oxidized portion 102X can be disposed adjacent to upper surface of the seed section 102. In some embodiments, the oxidized portion 102X may be formed by introducing oxygen gases or other oxidization techniques. In some embodiments, the material for the seed section 102 may include semiconductor compound such as silicon germanium, and the oxidization can help to condense the seed section 102. To be specific, since the oxidization abilities of different materials are different, the oxidization of the seed section 102 can be used to modify the composition of the seed section 102. By way of example, since silicon is more apt to be oxidized than germanium, if the original material for the seed section 102 is $Si_{0.7}Ge_{0.3}$, the material for the seed section 102 may be condensed to $Si_{0.5}Ge_{0.5}$ after the oxidization.

As shown in FIG. 6B, the oxidized portions 102X of the seed sections 102 are removed e.g., by etching. As shown in FIG. 6C, a plurality of first semiconductor structures 40 are epitaxially grown over the seed sections 102 to form a semiconductor device 3 of some embodiments of the present disclosure.

Figure 7A:
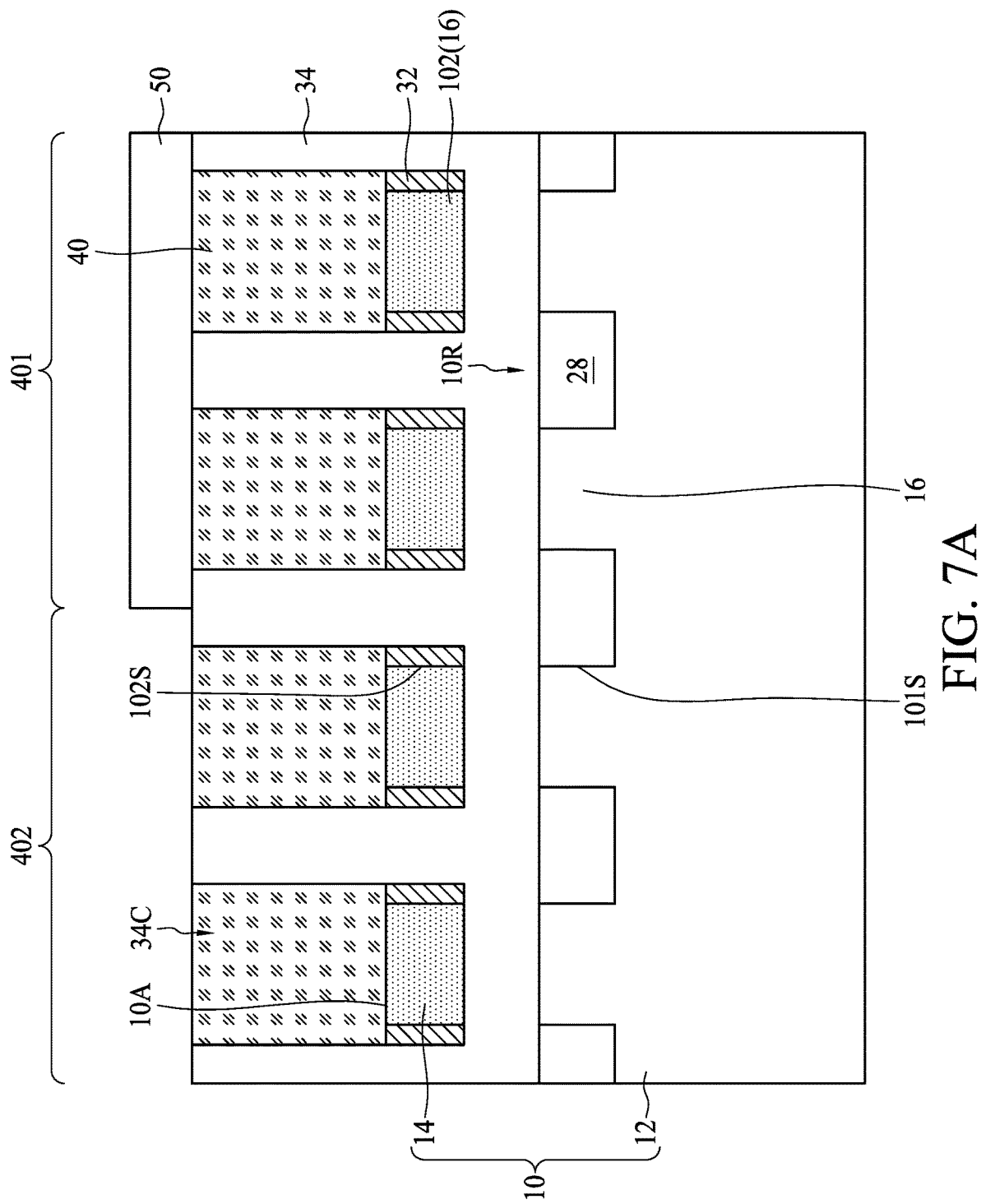
FIG. 7A, FIG. 7B and FIG. 7C are schematic views at one or more of various operations of manufacturing a semiconductor device in accordance with one or more embodiments of the present disclosure.
Figure 7B:
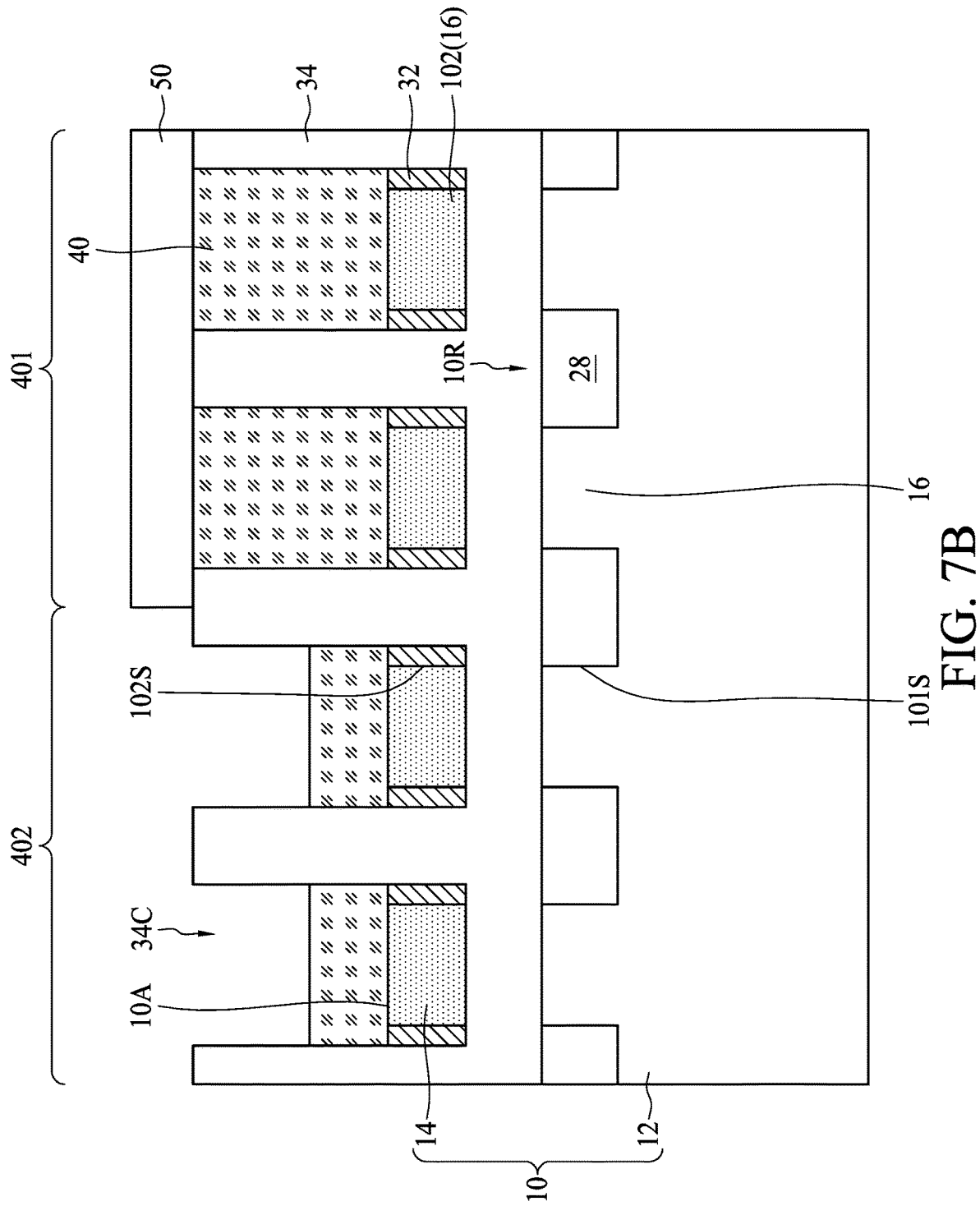
Figure 7C:
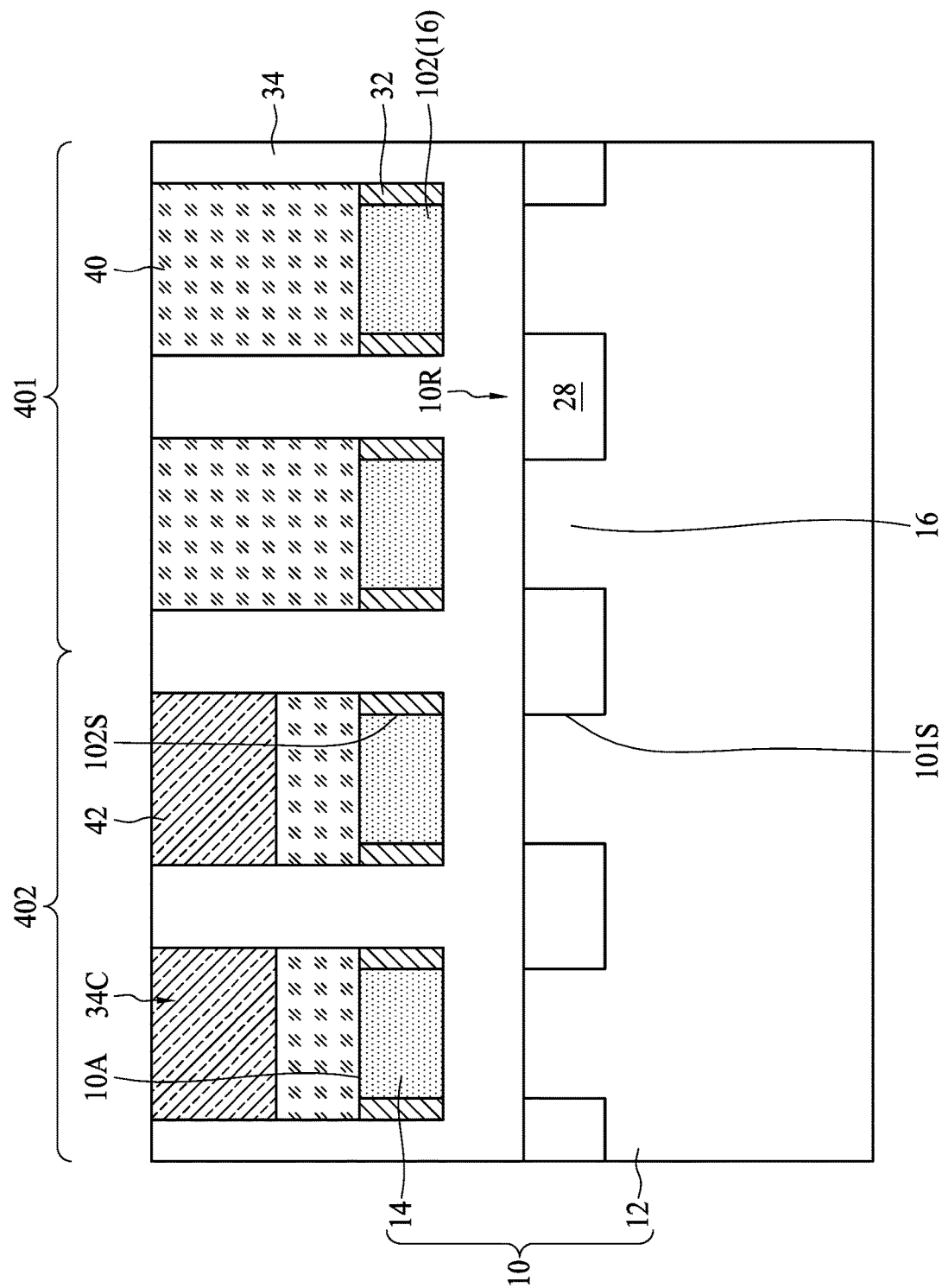

FIG. 7A, FIG. 7B and FIG. 7C are schematic views at one or more of various operations of manufacturing a semiconductor device in accordance with one or more embodiments of the present disclosure. In some embodiments, the operations illustrated in FIG. 7A can be performed subsequent to the operation illustrated in FIG. 3M, FIG. 5C or FIG. 6C. As shown in FIG. 7A, a mask layer 50 such as a photoresist layer is formed over the first semiconductor structures 40. The mask layer 50 covers a first portion 401 of the first semiconductor structures 40, and exposes a second portion 402 of the first semiconductor structures 40.

As shown in FIG. 7B, the second portion 402 of the first semiconductor structures 40 exposed from the mask layer 50 is partially removed e.g., by etching. As shown in FIG. 7C, a plurality of second semiconductor structures 42 are epitaxially grown over the remaining second portion 402 of the first semiconductor structure 40, and the mask layer 50 is removed to form a semiconductor device 4 of some embodiments of the present disclosure. In some embodiments, the materials of the seed sections 102, the first semiconductor structures 40 and the second semiconductor structures 42 have different lattice constants. The seed section 102 and the first semiconductor structure 40 stacked thereon form a stacked semiconductor structure. The seed section 102, the first semiconductor structure 40 and the second semiconductor structure 42 stacked to one another form another stacked semiconductor structure. In some embodiments, the first semiconductor structures 40 may be configured as channels of P type semiconductor device such as PMOS, and the second semiconductor structures 42 may be configured as channels of N type semiconductor device such as NMOS.

Example of the material for the seed sections 102 may include silicon germanium (SiGe) such as $Si_{0.5}Ge_{0.5}$. Example of the material for the first semiconductor structures 40 may include germanium (Ge), and example of the material for the second semiconductor structures 42 may include indium gallium arsenide (InGaAs). In some embodiments, materials for the first semiconductor structures 40 and the second semiconductor structures 42 can be individually selected to form strained channels and relaxed channels for different semiconductor devices.

Figure 8A:
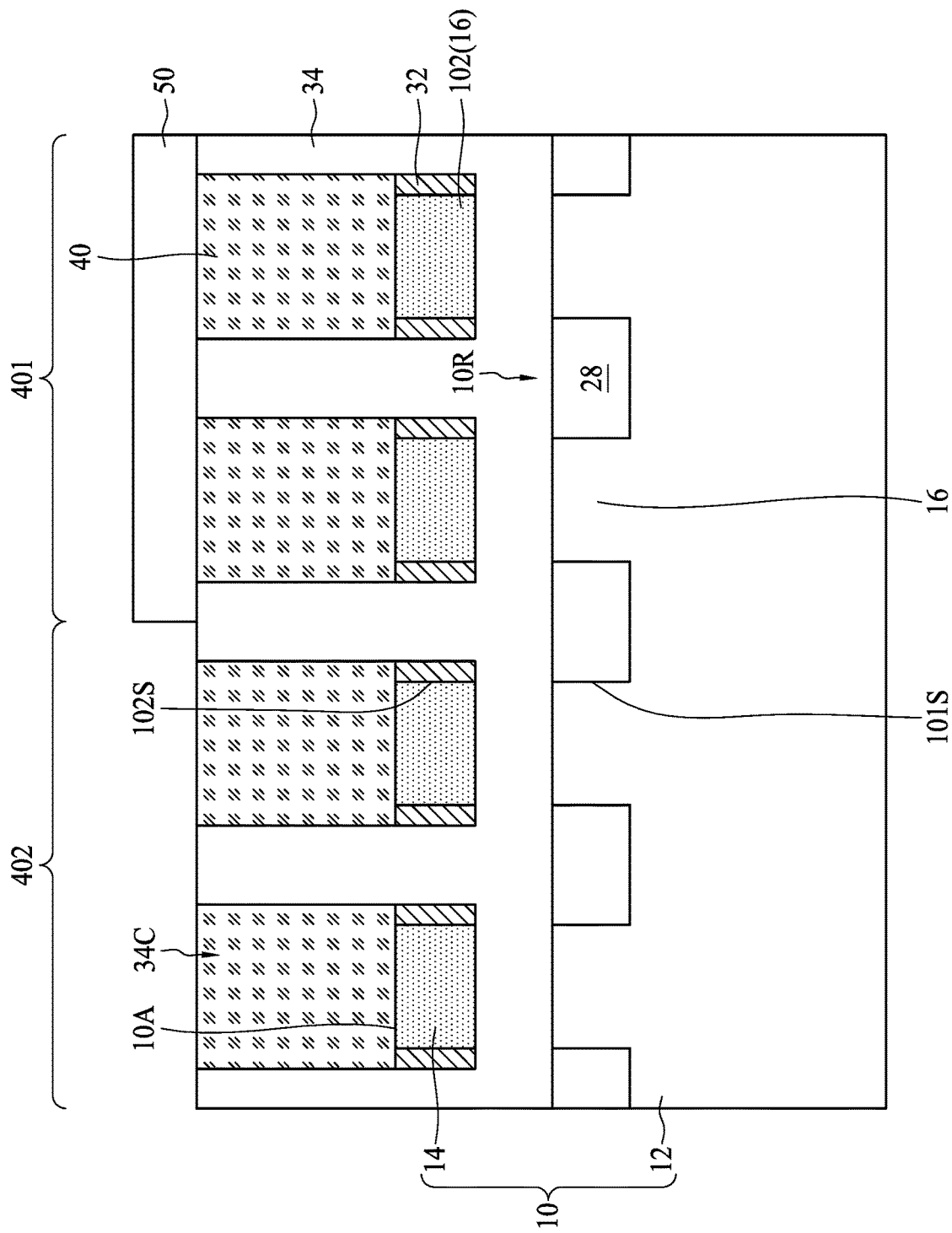
FIG. 8A, FIG. 8B, FIG. 8C, FIG. 8D and FIG. 8E are schematic views at one or more of various operations of manufacturing a semiconductor device in accordance with one or more embodiments of the present disclosure.

FIG. 8A, FIG. 8B, FIG. 8C, FIG. 8D and FIG. 8E are schematic views at one or more of various operations of manufacturing a semiconductor device in accordance with one or more embodiments of the present disclosure. In some embodiments, the operations illustrated in FIG. 8A can be performed subsequent to the operation illustrated in FIG. 3M, FIG. 5C, FIG. 6C or FIG. 7C. As shown in FIG. 8A, a mask layer 50 such as a photoresist layer is formed over the first semiconductor structures 40. The mask layer 50 covers a first portion 401 of the first semiconductor structures 40, and exposes a second portion 402 of the first semiconductor structures 40.

Figure 8B:
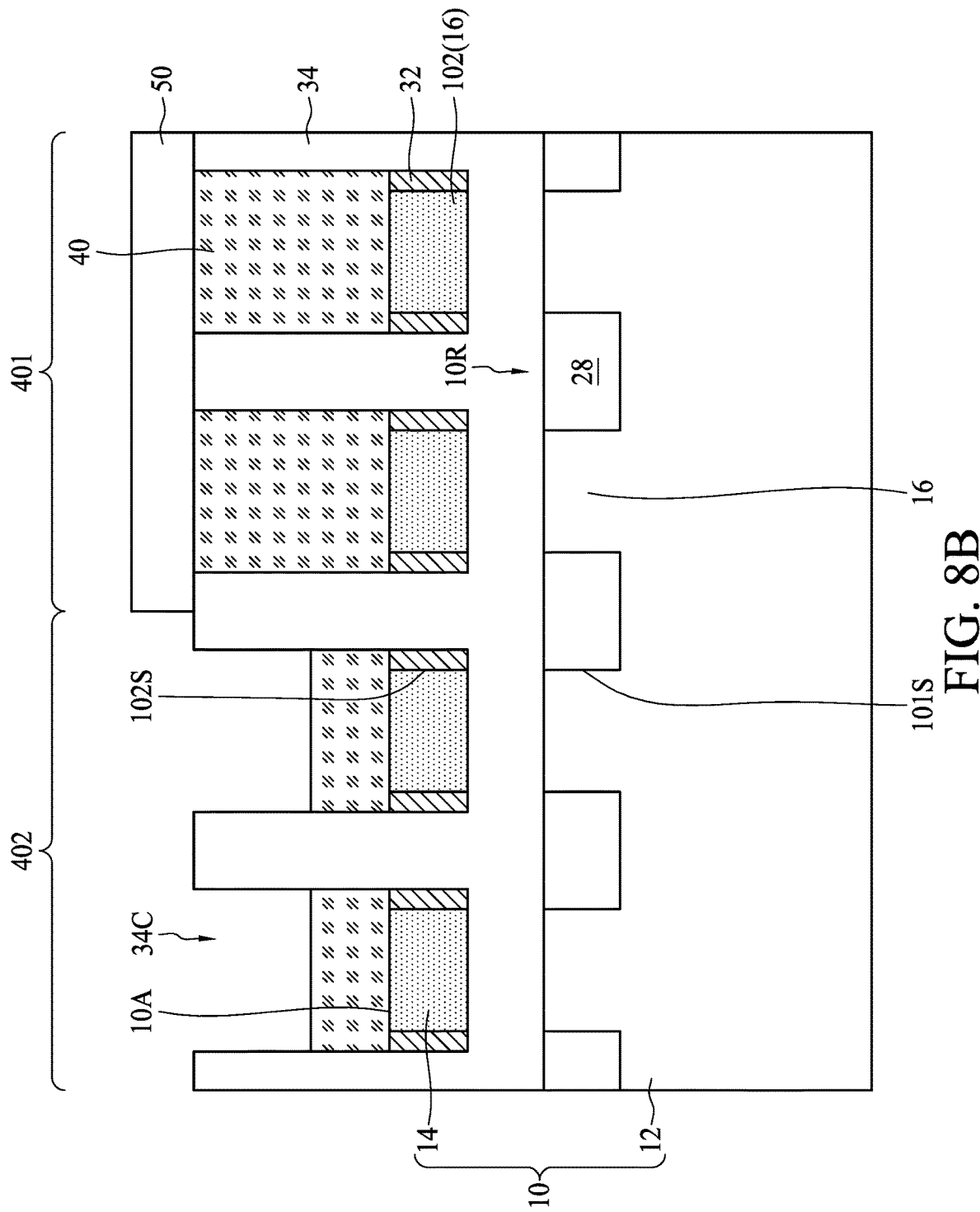
Figure 8C:
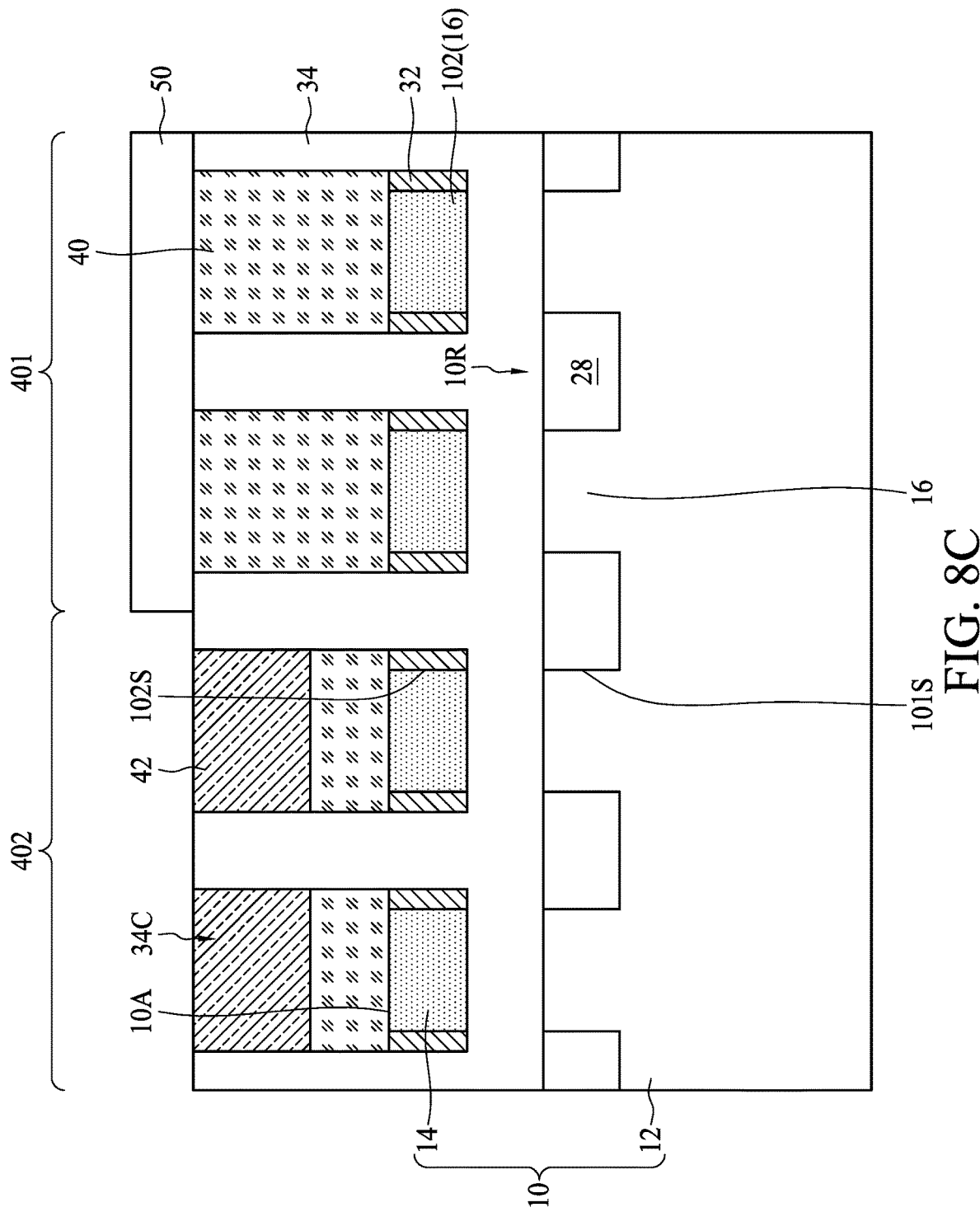

As shown in FIG. 8B, the second portion 402 of the first semiconductor structures 40 exposed from the mask layer 50 is partially removed e.g., by etching. As shown in FIG. 8C, a plurality of second semiconductor structures 42 are epitaxially grown over the remaining second portion 402 of the first semiconductor structure 40. In some embodiments, the material for the second semiconductor structures 42 and the first semiconductor structures 40 have different lattice constants.

Figure 8D:
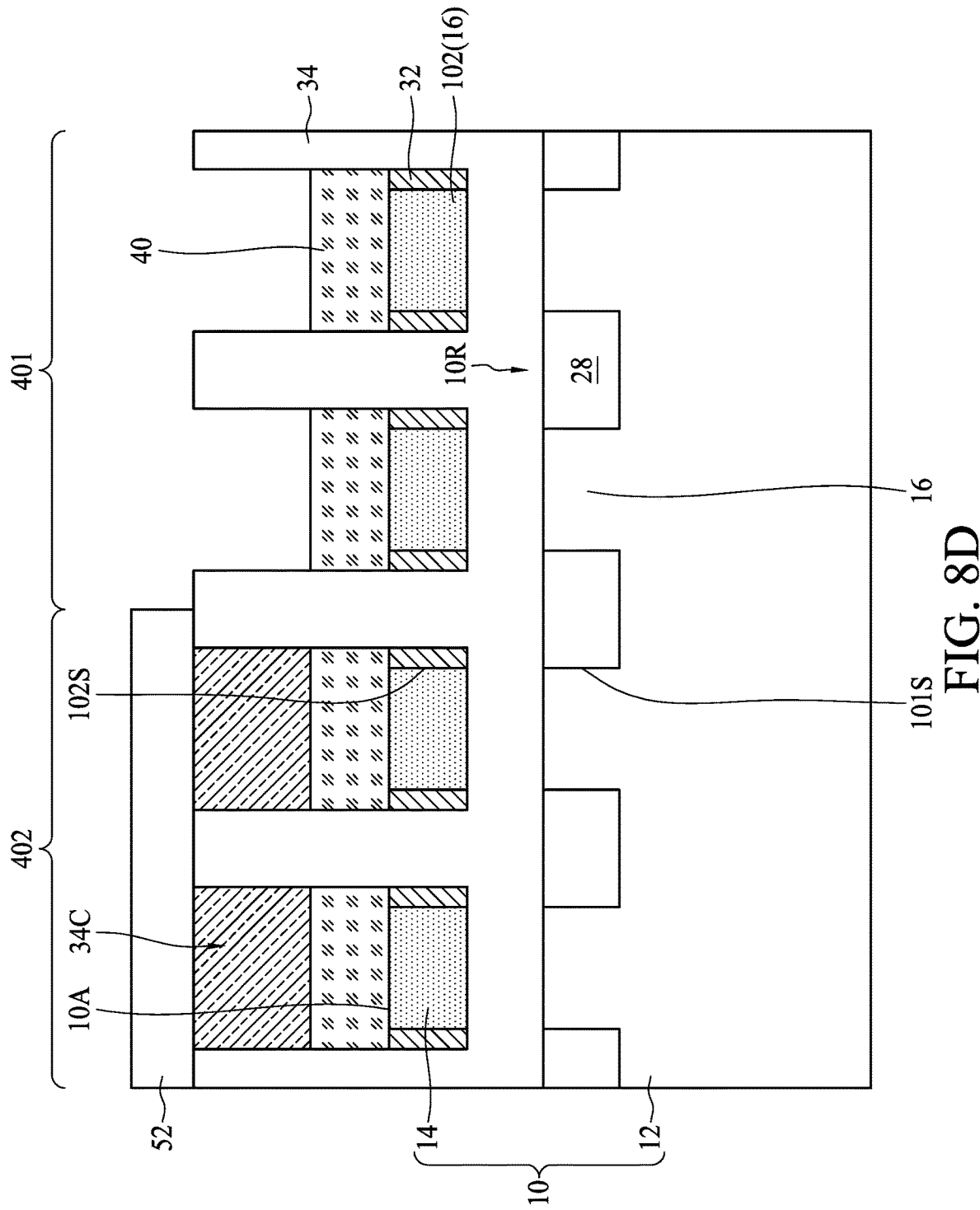

As shown in FIG. 8D, the mask layer 50 is removed. Another mask layer 52 such as a photoresist layer is formed over the second semiconductor structures 42. The mask layer 52 covers the second semiconductor structures 42, and exposes the first semiconductor structures 40. The first semiconductor structures 40 exposed from the mask layer 52 is partially removed e.g., by etching.

Figure 8E:
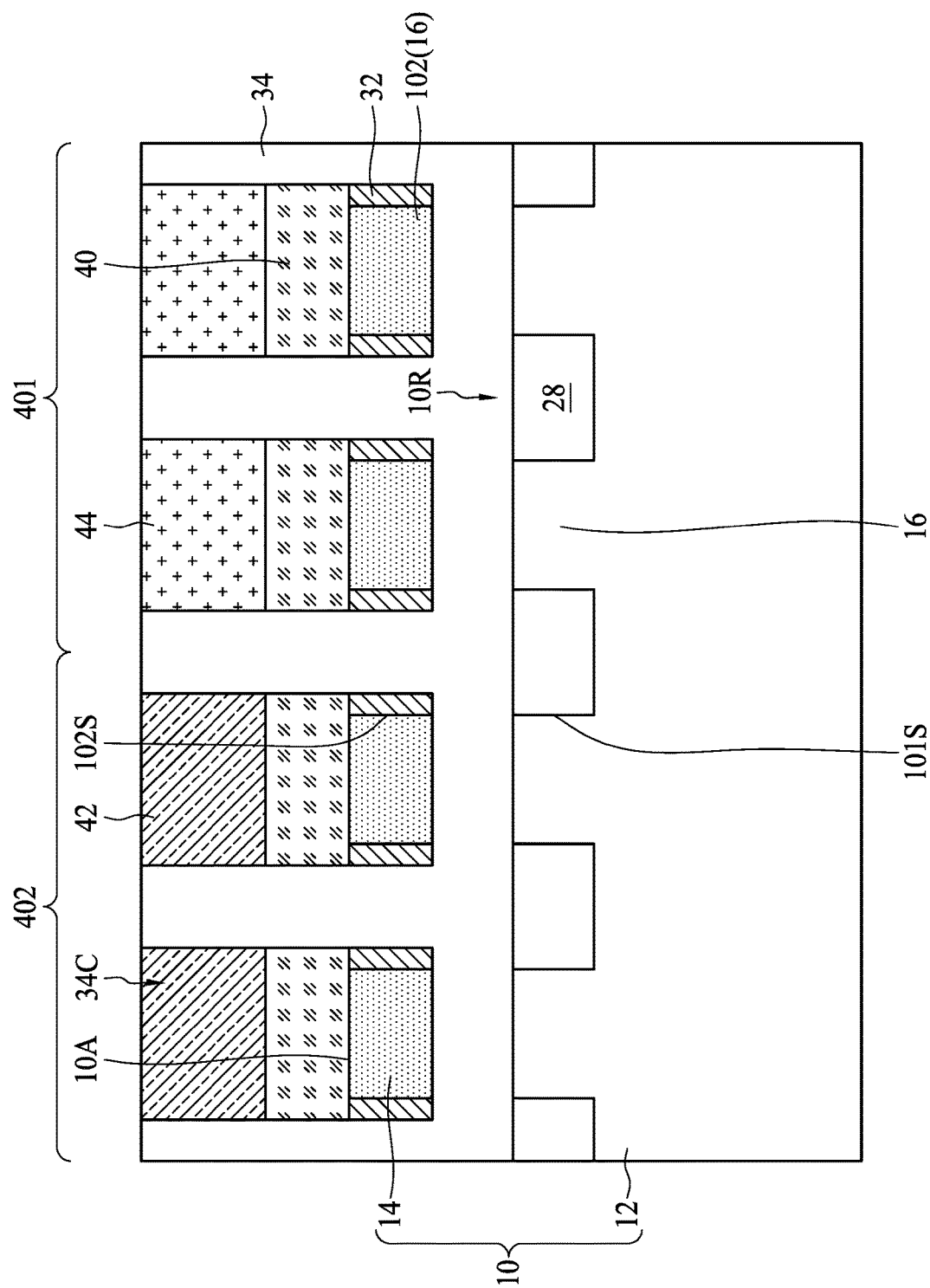

As shown in FIG. 8E, a plurality of third semiconductor structures 44 are epitaxially formed over the remaining first portion of the first semiconductor structures 40, and the mask layer 52 is removed to form a semiconductor device 5 of some embodiments of the present disclosure. In some embodiments, the materials of the seed sections 102, the first semiconductor structures 40, the second semiconductor structures 42 and the third semiconductor structures 44 have different lattice constants. The seed section 102, the first semiconductor structure 40 and the second semiconductor structure 42 stacked to one another form a stacked semiconductor structure. The seed section 102, the first semiconductor structure 40 and the third semiconductor structure 44 stacked to one another form another stacked semiconductor structure. In some embodiments, the first semiconductor structures 40 may be configured as buffer regions, the second semiconductor structures 42 may be configured as channels of N type semiconductor device such as NMOS, and the third semiconductor structures 44 may be configured as channels of P type semiconductor device such as PMOS. Example of the material for the seed sections 102 may include silicon (Si). Example of the material for the first semiconductor structures 40 may include silicon germanium (SiGe) such as $Si_{0.5}Ge_{0.5}$. Example of the material for the second semiconductor structures 42 may include silicon. Example of the material for the third semiconductor structures 44 may include germanium. In some embodiments, materials for the first semiconductor structures 40, the second semiconductor structures 42 and the third semiconductor structures 44 can be selected to form strained channels and relaxed channels for different semiconductor devices.

Figure 9A:
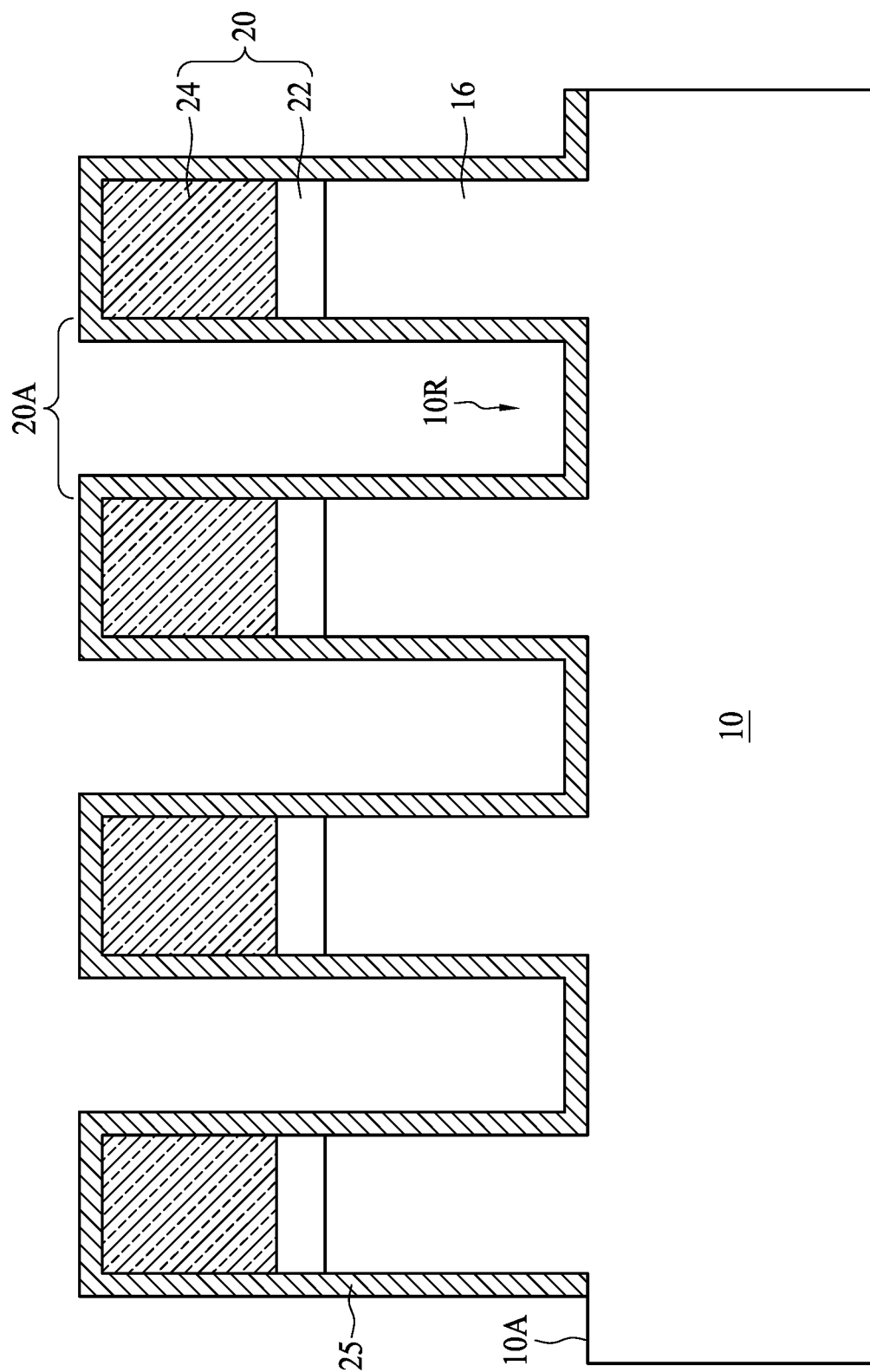
FIG. 9A, FIG. 9B, FIG. 9C, FIG. 9D, FIG. 9E, FIG. 9F, FIG. 9G and FIG. 9H are schematic views at one or more of various operations of manufacturing a semiconductor device in accordance with one or more embodiments of the present disclosure.

FIG. 9A, FIG. 9B, FIG. 9C, FIG. 9D, FIG. 9E, FIG. 9F, FIG. 9G and FIG. 9H are schematic views at one or more of various operations of manufacturing a semiconductor device in accordance with one or more embodiments of the present disclosure. As shown in FIG. 9A, a semiconductor substrate 10 is received. In some embodiments, the semiconductor substrate 10 is a bulk semiconductor substrate. A patterned mask layer 20 is formed over a surface 10A of the semiconductor substrate 10 as a hark mask. The semiconductor substrate 10 is then patterned e.g. by etching through openings 20A of the patterned mask layer 20 to form a plurality of protrusions 16 spaced from one another. In some embodiments, a liner insulative layer 25 may be formed over the semiconductor substrate 10, the protrusions 16 and the patterned mask layer 20.

Figure 9B:
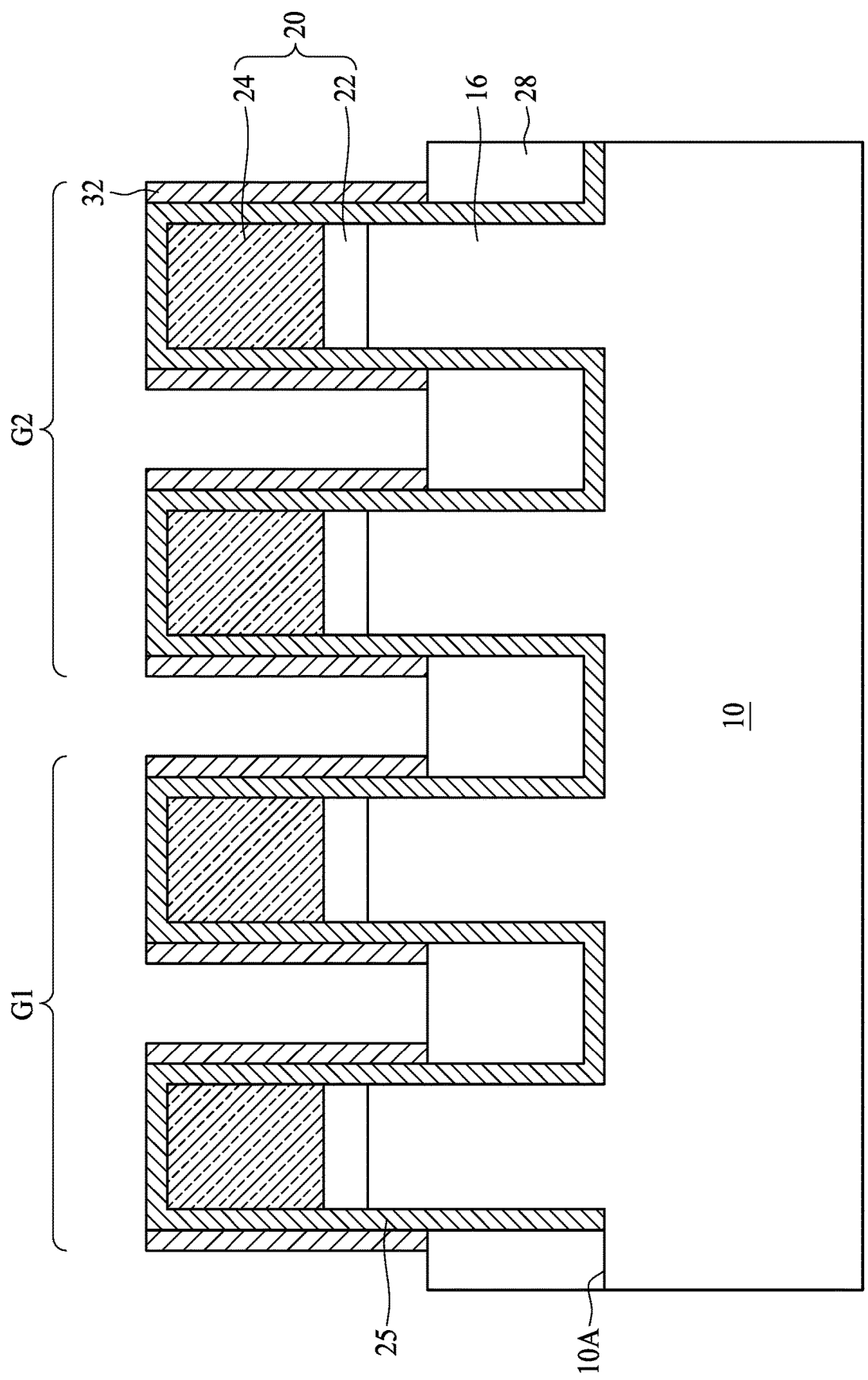

As shown in FIG. 9B, a plurality of first insulative structures 28 are formed in the recesses 10R respectively. In some embodiments, the first insulative structures 28 partially cover sidewalls of the protrusions 16. In some embodiments, a plurality of spacers 32 are formed, partially covering the sidewalls of the protrusions 16. In some embodiments, the spacers 32 may further cover the sidewalls of the patterned mask layer 20.

Figure 9C:
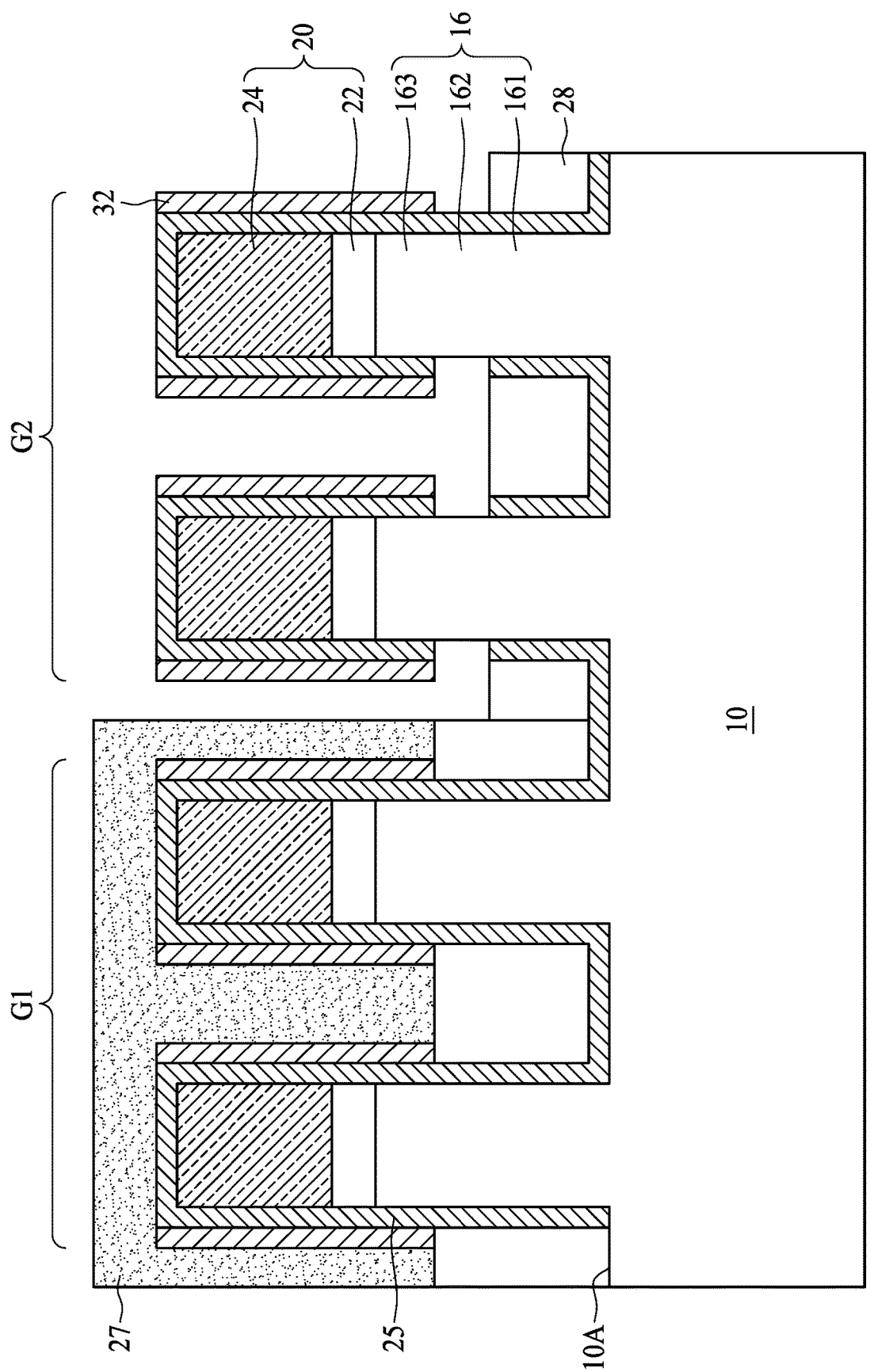

As shown in FIG. 9C, a first resist layer 27 such as a photoresist layer is formed to cover a first group G1 of the protrusions 16 and the first insulative structures 28, and expose a second group G2 of the protrusions 16 and the first insulative structures 28. The first insulative structures 28 of the second group G2 exposed through the first resist layer 27 are then partially removed e.g., by etching to reduce the thickness of the first insulative structures 28. The exposed liner insulative layer 25 may also be removed. Accordingly, middle portions 162 of the protrusions 16 of the second group G2 are exposed, while bottom portions 161 and top portions 163 of the second group G2 are covered.

Figure 9D:
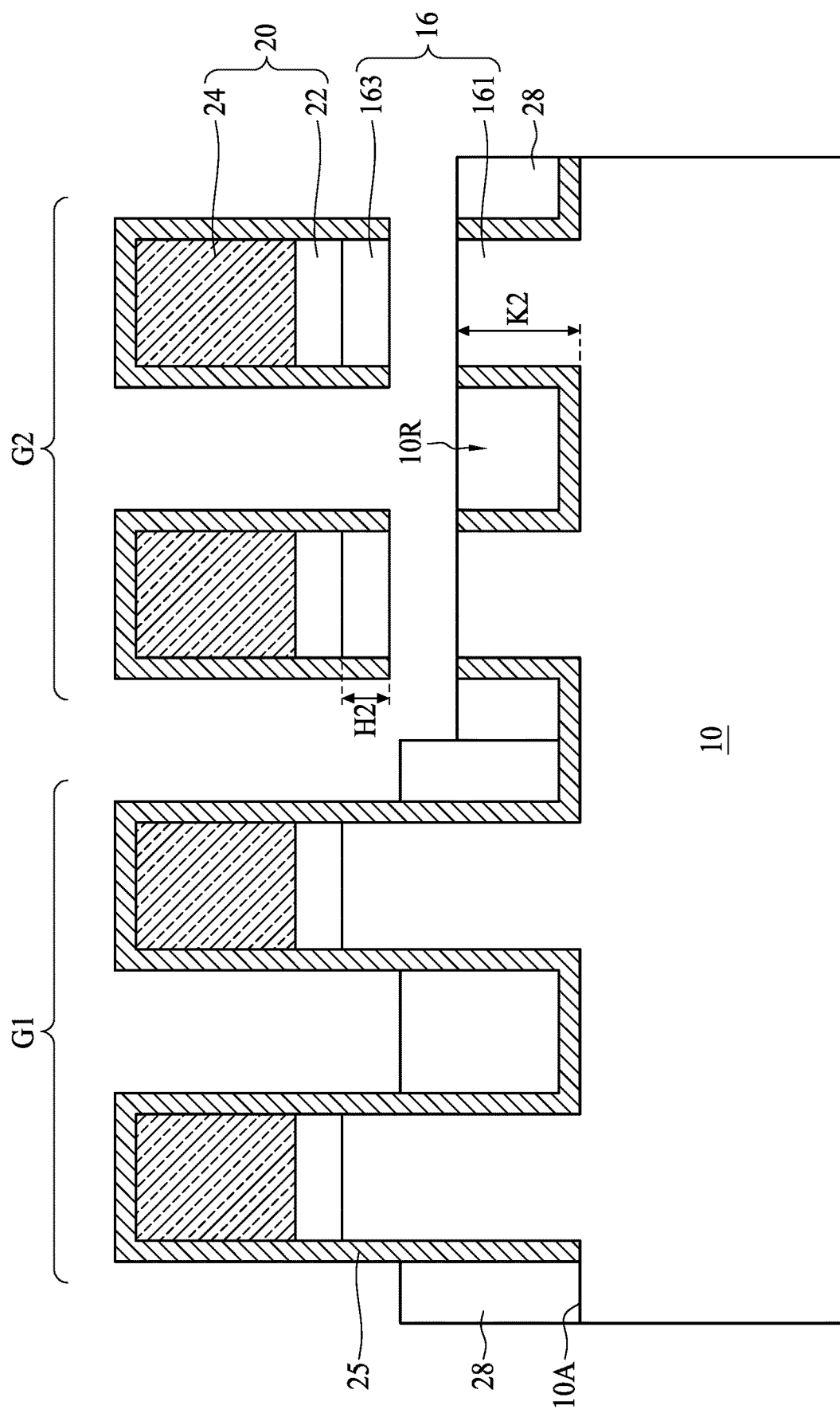

As shown in FIG. 9D, the first resist layer 27 and the spacers 32 are removed. The exposed middle portions 162 are removed, while the bottom portions 161 and the top portion 163 are preserved. After the middle portions 162 are removed, two ends of the top portion 163 are still connected to the semiconductor substrate 10 and configured as anchor portions, such that the top portion 163 does not fall. After the middle portion 162 is removed, the top portion 163 and the bottom portion 161 are separated from each other. The top portion 163 of the second group G2 is configured as a seed section, and has a thickness H2. The bottom portion 161 is connected to the semiconductor substrate 10, and configured as a protrusion. The bottom portion 161 of the second group G2 has a thickness K2.

Figure 9E:
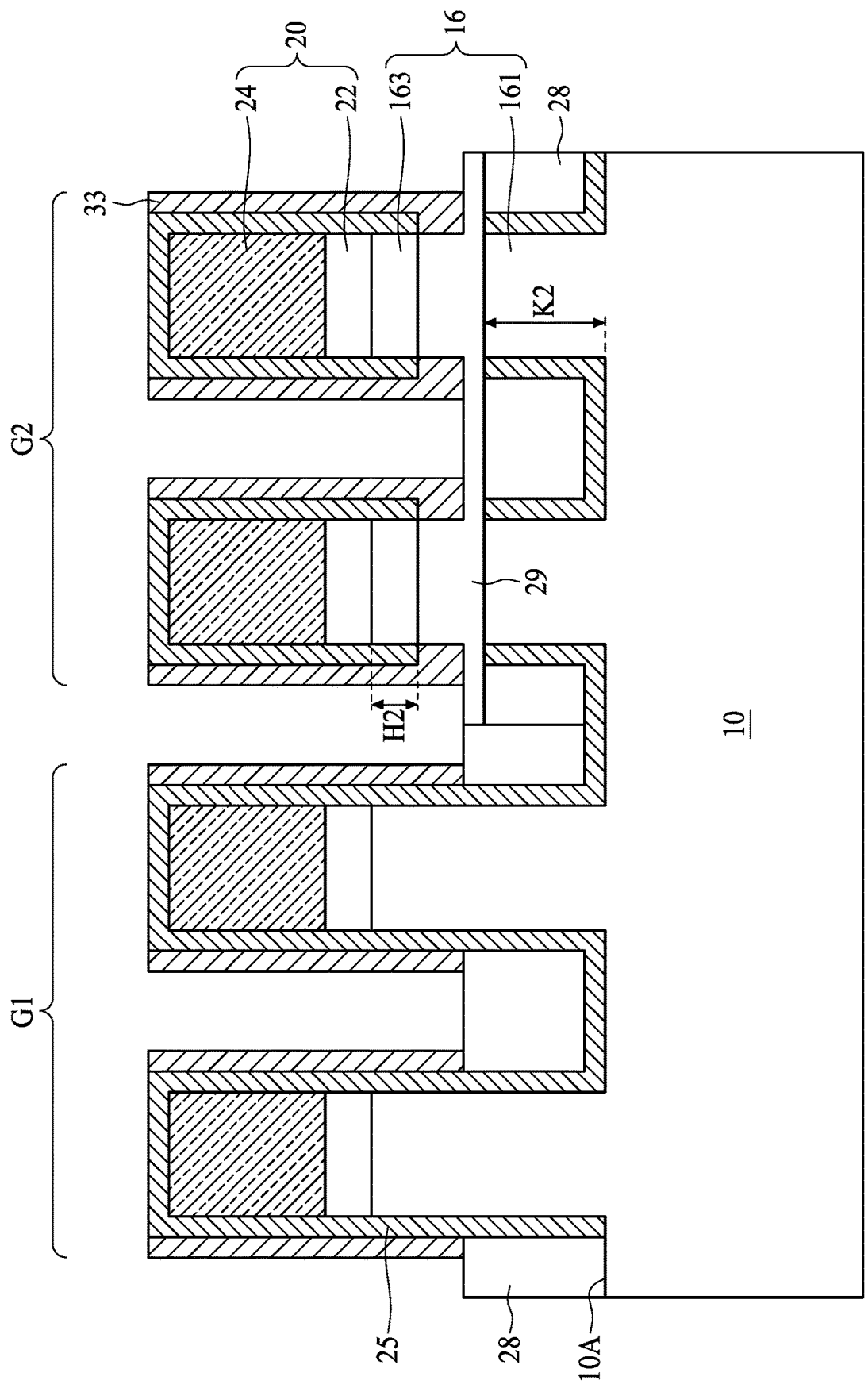

As shown in FIG. 9E, an insulative layer 29 is formed over the semiconductor substrate 10. The insulative layer 29 is then partially removed, and the insulative layer 29 between the upper portion 163 and the bottom portion 161 of the protrusion 16 of the second group G2 is reserved. In some embodiments, the first insulative structures 28 are partially removed along with the insulative layer 29, such that the insulative layer 29 and the first insulative structures 28 of the first group G1 may be substantially coplanar. In some embodiments, a plurality of second spacers 33 are formed, partially covering the sidewalls of the protrusions 16. In some embodiments, the second spacers 33 may further cover the sidewalls of the patterned mask layer 20. In some embodiments, the insulative layer 29 can be used to support the upper portion 163. Once the insulative layer 29 is formed, two ends of the upper portion 163 may be removed and disconnected from the semiconductor substrate 10 in successive operations. In some embodiments, the material for the insulative layer 29 may be the same as the first insulative structure 28.

Figure 9F:
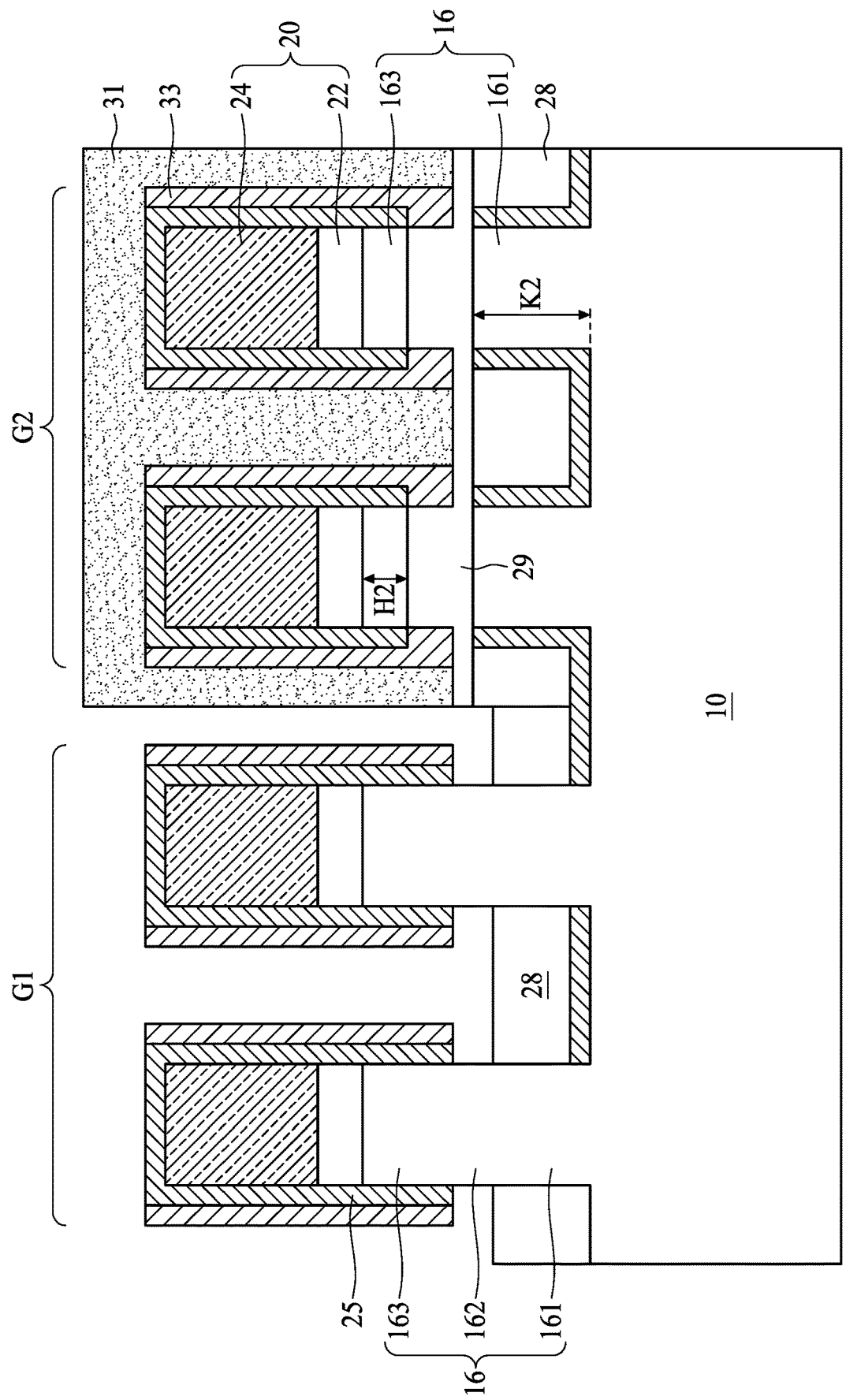

As shown in FIG. 9F, a second resist layer 31 such as a photoresist layer is formed to cover the second group G2 of the protrusions 16 and the insulative layer 29, and expose the first group G1 of the protrusions 16 and the first insulative structures 28. The first insulative structures 28 of the first group G1 exposed through the second resist layer 31 are then partially removed e.g., by etching to reduce the thickness of the first insulative structures 28. The exposed liner insulative layer 25 may also be removed. Accordingly, middle portions 162 of the protrusions 16 of the first group G1 are exposed, while bottom portions 161 and top portions 163 of the first group G1 are covered. The thickness of the first insulative structures 28 of the first group G1 is different from the thickness of the first insulative structures 28 of the second group G2. By way of example, the thickness of the first insulative structures 28 of the second group G2 is less than the thickness of the first insulative structures 28 of the first group G1. Accordingly, the thicknesses of the bottom portion 161, the middle portion 162 and the top portion 163 of the protrusion 16 of the first group G1 is different from that of the second group G2.

Figure 9G:
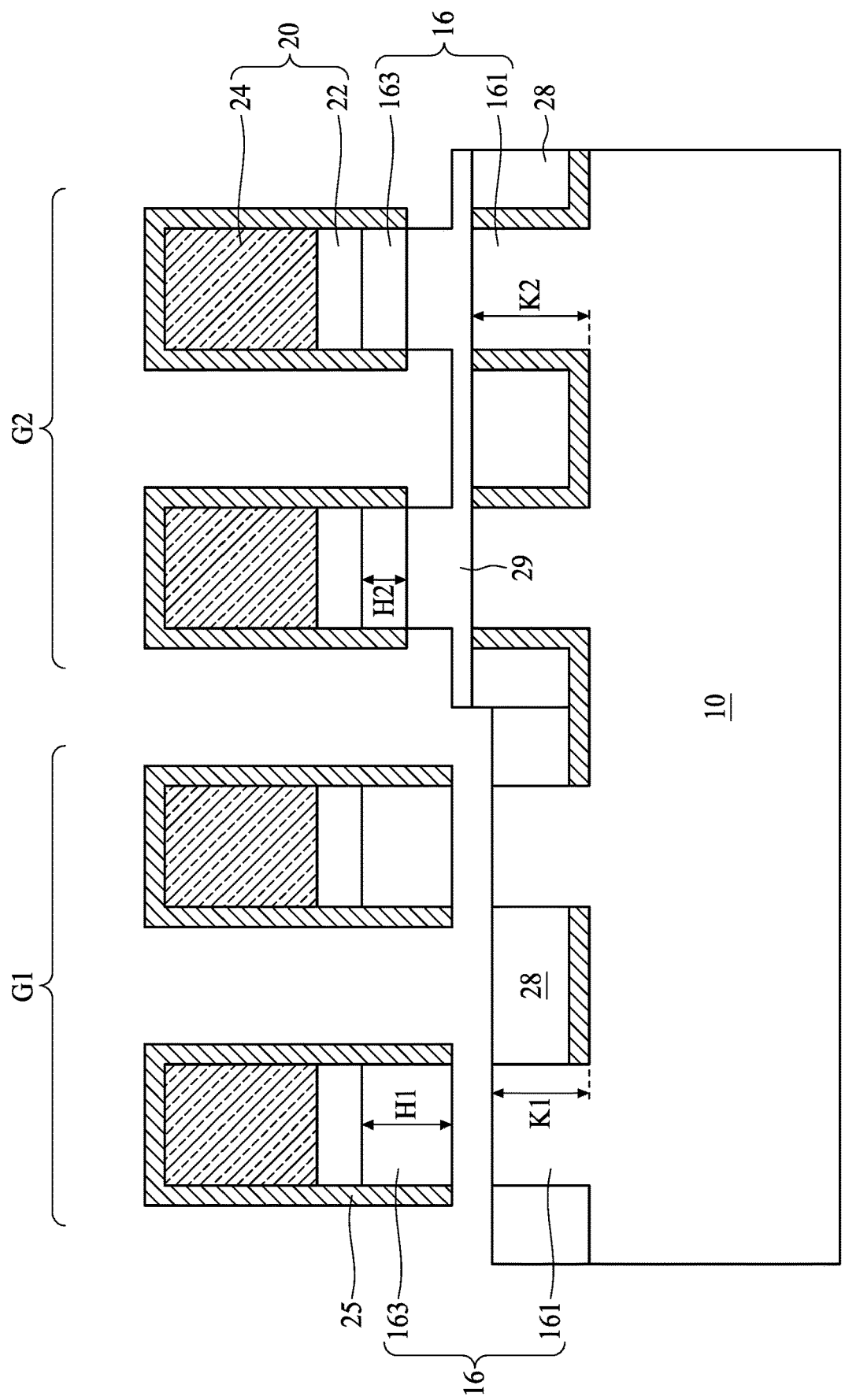

As shown in FIG. 9G, the second resist layer 31 and the second spacers 33 are removed. The exposed middle portions 162 are removed, while the bottom portions 161 and the top portion 163 are preserved. After the middle portion 162 is removed, the top portion 163 and the bottom portion 161 are separated from each other. The top portion 163 of the first group G1 is configured as a seed section, and has a thickness H1 different from the thickness H2 of the top portion 163 of the second group G2. For example, the thickness H1 is larger than the thickness H2. The bottom portion 161 of the first group G1 is connected to the semiconductor substrate 10, and configured as a protrusion. The bottom portion 161 of the first group G1 has a thickness K1 different from the thickness K2 of the bottom portion 161 of the second group G2. For example, the thickness K1 is less than the thickness K2.

Figure 9H:
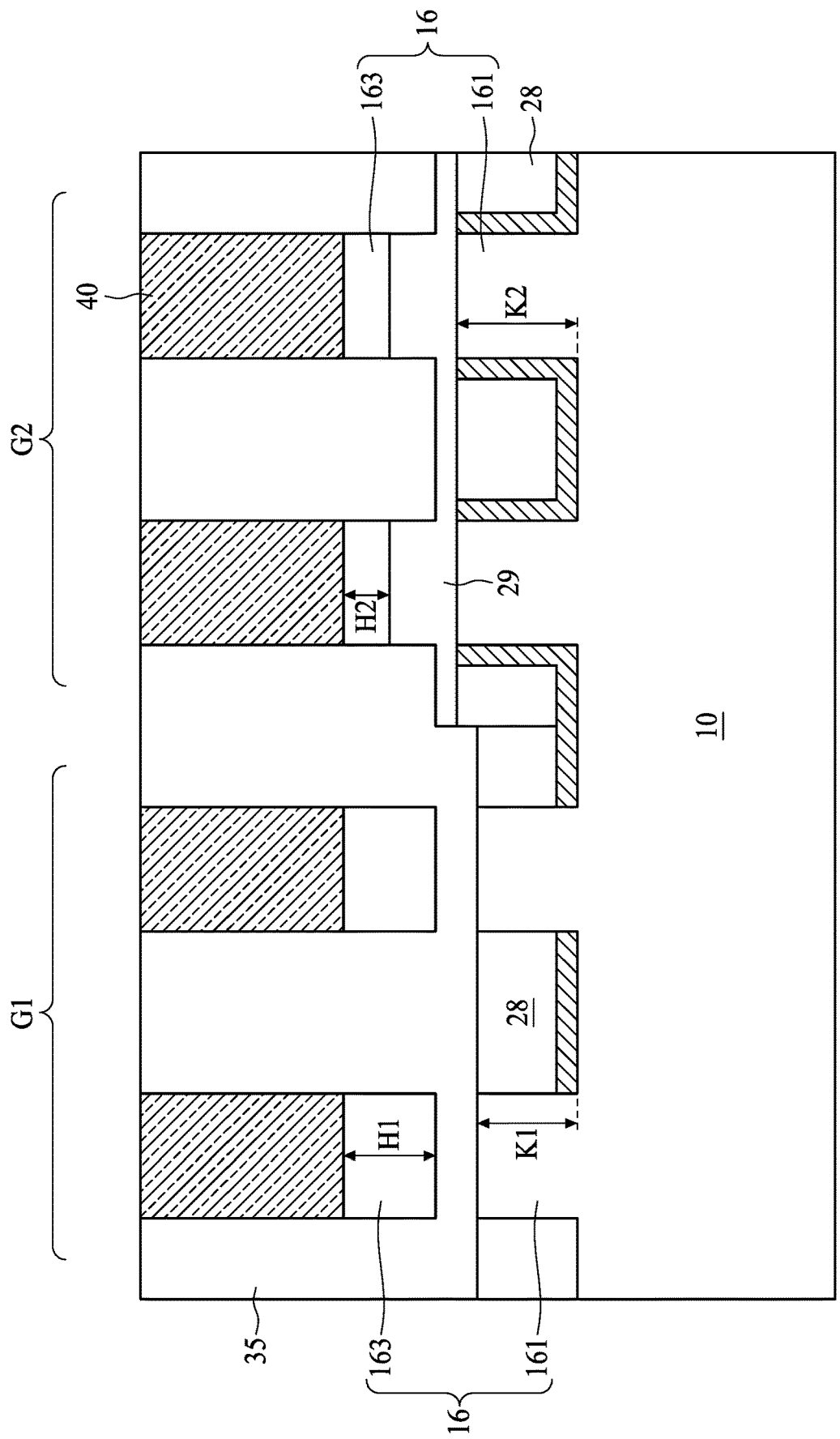

As shown in FIG. 9H, another insulative layer 35 is formed over the semiconductor substrate 10. The material for the insulative layer 35 may be the same as the insulative layer 29. For example, the material for the insulative layer 35 may include oxide compound such as silicon oxide or other suitable insulative or dielectric materials. The patterned mask layer 20 is removed to expose the top portions 163 of the protrusions 16. In some embodiments, a plurality of first semiconductor structures 40 are epitaxially grown over the top portions 163 to form a semiconductor device 6 of some embodiments of the present disclosure. The top portion 163 and the first semiconductor structure 40 may form a stacked semiconductor channel, wherein the top portion 163 is configured as a bottom semiconductor channel, and the first semiconductor structure 40 is configured as an upper semiconductor channel. In some embodiments, the material for the first semiconductor structures 40 may be the same as or different from the top portions 163. Example of the material for the first semiconductor structures 40 may include, but is not limited to, silicon, germanium, silicon germanium, other semiconductor materials such as III group, IV group or V group element or compound, or the like. In some embodiments, the top portion 163 is configured as a seed layer to epitaxially grow the first semiconductor structure 40. The thickness of top portion 163 is less than the critical thickness of the material for the top portion 163, i.e., the top portion 163 is in a substantially defect-free state. Accordingly, defects will be inhibited when the first semiconductor structure 40 is epitaxially grown on the top portion 163 in a substantially defect-free state. In some embodiments, the top portion 163 is also configured as a medium for stain transfer. The thickness of the first semiconductor structure 40 is not limited by its critical thickness, and the first semiconductor structure 40 may be thicken without or with fewer defects since the strain energy achieves saturation. The first semiconductor structure 40 may be configured as an inverse virtual substrate. The first semiconductor structures 40 epitaxially grown on the top portion 163 can be strained, and thus device performance can be enhanced. In some embodiments, the difference between the top portions 163 of the first group G1 and the second group G2 allows to form semiconductor structures with different properties.

In some embodiments, some or all of the first semiconductor structures 40 of the first group G1 and/or the second group G2 may be removed, and replaced by another semiconductor structures as described in some embodiments of FIGS. 7A-7C or FIGS. 8A-8C.

Figure 10:
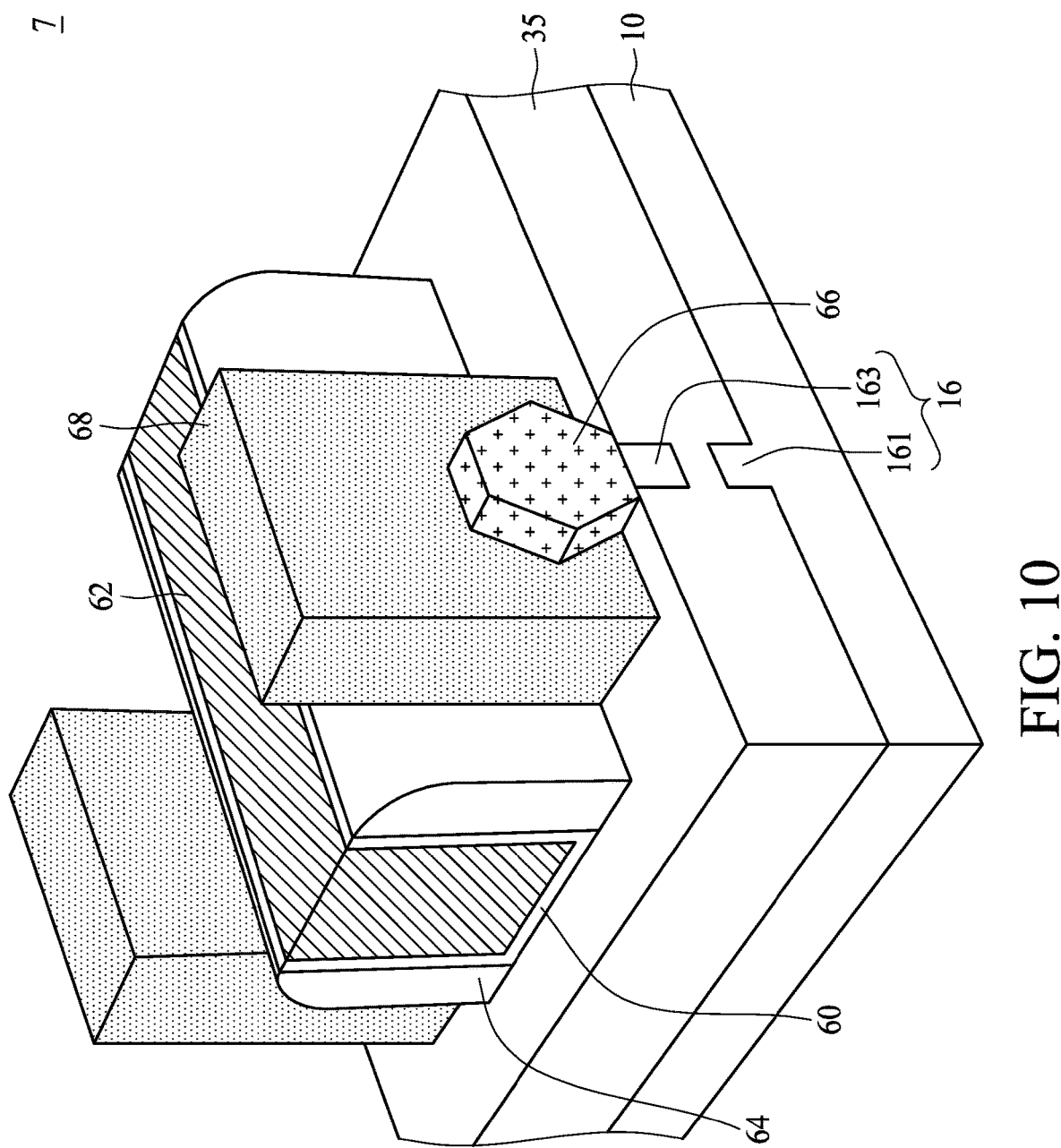
FIG. 10 a schematic view of a semiconductor device in accordance with one or more embodiments of the present disclosure.
Figure 11:
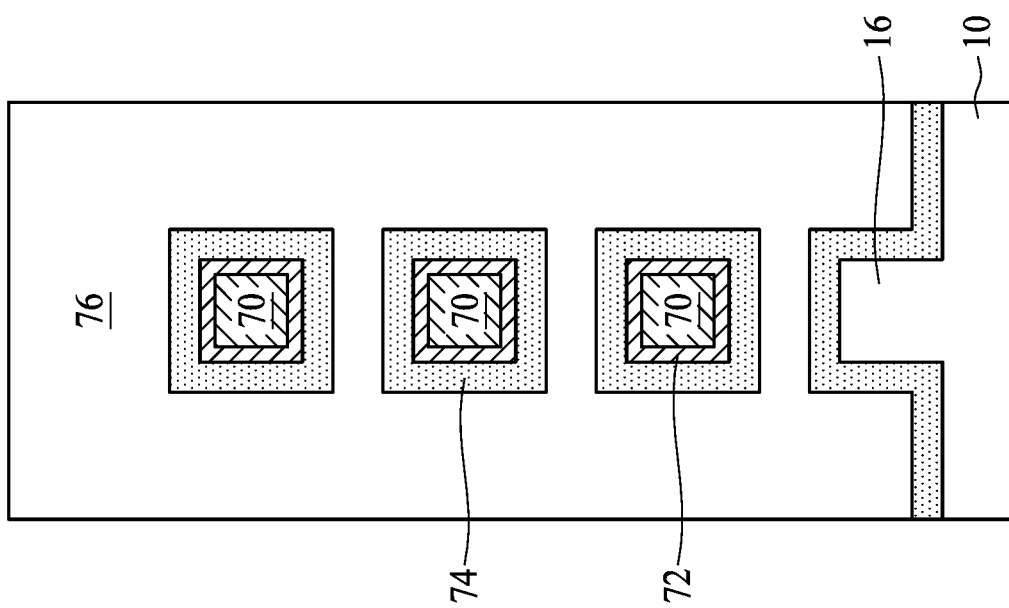
FIG. 11 a schematic view of a semiconductor device in accordance with one or more embodiments of the present disclosure.

FIG. 10 a schematic view of a semiconductor device in accordance with one or more embodiments of the present disclosure. As shown in FIG. 10, the semiconductor device 7 may be a finFET device. In some embodiments, the semiconductor structure (such as the first semiconductor structure 40, the second semiconductor structure 42 and/or the third semiconductor structure 44) formed on the top portion 163 of the protrusion 16 may be configured as a fin of the finFET device. The semiconductor device 7 may further include a gate dielectric 60, a gate electrode 62 such as a metal gate electrode over the gate dielectric 60, and a pair of spacers 64 alongside the gate electrode 62. The semiconductor device 7 may further include a pair of source/drain regions 66 electrically connected to two opposing ends of the fin, and a pair of contact vias 68 electrically connected to the pair of source/drain regions 66. FIG. 11 a schematic view of a semiconductor device in accordance with one or more embodiments of the present disclosure. As shown in FIG. 11, the semiconductor device 8 may be a gate-all-around (GAA) transistor device. In some embodiments, the semiconductor structure (such as the first semiconductor structure 40, the second semiconductor structure 42 and/or the third semiconductor structure 44) may be used to form nano wires 70 of the GAA transistor device. The semiconductor device 8 may further include interfacial layers 72 surrounding the nano wires 70, and high K dielectric layers 74 covering the interfacial layers 72. The semiconductor device 8 may further include a gate electrode 76 surrounding the nano wires 70, and source/drain regions (not shown).

In some embodiments of the present disclosure, a semiconductor seed layer with a thickness less than its critical thickness is used as a seed layer and a strain transfer medium. The substantially defect-free semiconductor seed layer allows another semiconductor layer epitaxially grown thereon to be strained. The semiconductor seed layer also allows the semiconductor layer epitaxially grown thereon to be substantially defect-free even when the thickness of the semiconductor layer exceeds its theoretical critical thickness. In some embodiments of the present disclosure, some portion or all of the semiconductor layer may be replaced with another different semiconductor material, and the thickness of the replacing semiconductor material is also substantially defect-free and not limited by its theoretical critical thickness. In some embodiments of the present disclosure, the strained, thick and substantially defect-free (or defect-less) epitaxially grown semiconductor material may enhance the performance of semiconductor device such as electron mobility, and may be applied to various types of semiconductor devices such as logic MOSFET device, optoelectronic integrated circuit (OEIC) such as CMOS sensor, or III-V based semiconductor device such as high electron mobility transistor (HEMT), photo diode or laser device.

In one exemplary aspect, a method for manufacturing a semiconductor device is provided. A semiconductor substrate is received. The semiconductor substrate is patterned to form a plurality of protrusions spaced from one another, wherein the protrusion comprises a base section, and a seed section stacked on the base section. A plurality of first insulative structures are formed, covering sidewalls of the base sections and exposing sidewalls of the seed sections. A plurality of spacers are formed, covering the sidewalls of the seed sections. The first insulative structures are partially removed to partially expose the sidewalls of the base sections. The base sections exposed from the first insulative structures are removed. A plurality of second insulative structures are formed under the seed sections.

In another aspect, a method for manufacturing a semiconductor device is provided. A semiconductor substrate is received. The semiconductor substrate is patterned to form a plurality of protrusions spaced from one another. Sidewalls of top portions and bottom portions of the plurality of protrusions are covered, with middle portions of the plurality of protrusions being exposed. The middle portions of the plurality of protrusions are removed. An insulative layer is formed between the bottom portions and the top portions of the plurality of protrusions. A plurality of semiconductor structures are grown on the top portions of the protrusions.

In yet another aspect, a semiconductor device includes a semiconductor substrate, an insulative layer, and a plurality of stacked semiconductor structures. The semiconductor substrate includes a surface, and a plurality of protrusions protruded from the surface of the semiconductor substrate. The insulative layer is over the semiconductor substrate. The stacked semiconductor structures are over the insulative layer, wherein the plurality of protrusions are substantially aligned with the plurality of protrusions, and apart from the plurality of protrusions by the insulative layer.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
   receiving a semiconductor substrate;
   patterning the semiconductor substrate to form a plurality of protrusions spaced from one another, wherein the protrusions each comprises a base section, and a seed section stacked on the base section;
   partially oxidizing each of the seed sections to form an oxidized portion in each of the seed sections;

removing the oxidized portions of the seed sections;
forming a plurality of first insulative structures, covering sidewalls of the base sections and exposing sidewalls of the seed sections;
forming a plurality of spacers covering the sidewalls of the seed sections;
partially removing the first insulative structures to partially expose the sidewalls of the base sections;
removing the base sections exposed from the first insulative structures; and
forming a plurality of second insulative structures under the seed sections.

2. The method of claim 1, wherein the semiconductor substrate comprises a semiconductor base and a semiconductor seed layer over the semiconductor base, the base sections are portions of the semiconductor base, and the seed sections are portions of the semiconductor seed layer.

3. The method of claim 1, wherein the semiconductor substrate comprises a bulk semiconductor substrate, and the base sections and the seed sections are portions of the bulk semiconductor substrate.

4. The method of claim 1, wherein the patterning the semiconductor substrate to form the plurality of protrusions comprises:
forming a patterned mask layer over a surface of the semiconductor substrate, wherein the patterned mask layer includes a plurality of openings partially exposing the surface of the semiconductor substrate; and
removing a portion of the semiconductor substrate through the openings of the patterned mask layer to form the plurality of protrusions, wherein the seed section is between the respective base section and the patterned mask layer.

5. The method of claim 1, wherein a material for the seed sections comprises silicon or silicon germanium.

6. The method of claim 1, wherein a thickness of the seed section of a first group of protrusions is different from a thickness of the seed section of a second group of protrusions.

7. The method of claim 1, wherein a thickness of the seed section is less than a critical thickness of a material for the seed section.

8. The method of claim 1, further comprising epitaxially growing a plurality of first semiconductor channels over the seed sections respectively subsequent to formation of the second insulative structures.

9. The method of claim 8, wherein a material for the first semiconductor channels comprises germanium.

10. The method of claim 8, further comprising:
covering first portions of the first semiconductor channels;
partially removing second portions of the first semiconductor channels; and
epitaxially growing a plurality of second semiconductor channels over the remaining second portions of the first semiconductor channels.

11. The method of claim 10, further comprising:
covering the plurality of second semiconductor channels;
partially removing the first portions of the first semiconductor channels; and
epitaxially growing a plurality of third semiconductor channels over the remaining first portions of the first semiconductor channels.

12. A method for manufacturing a semiconductor device, comprising:
receiving a semiconductor substrate;
patterning the semiconductor substrate to form a plurality of first protrusions and second protrusions;
replacing bottom portions of the second protrusions with a plurality of first insulative layers, while top portions of the second protrusions remain;
replacing bottom portions of the first protrusions with a plurality of second insulative layers, while top portions of the first protrusions remain, wherein a thickness of the top portion of the first protrusion is different from a thickness of the second protrusion;
using the top portions of the first protrusions and second protrusions with different thicknesses as seed layers to grow a plurality of first semiconductor structures; and
replacing a portion of the first semiconductor structures with a plurality of second semiconductor structures having a different material from that of the first semiconductor structures.

13. The method of claim 12, further comprising:
forming a plurality of first insulative structures, covering a portion of sidewalls of the first and second protrusions; and
forming a plurality of spacers covering another portion of the sidewalls of the first and second protrusions.

14. The method of claim 13, further comprising:
covering the first protrusions and a portion of first insulative structures between the first protrusions with a first resist layer, and thinning the first insulative structures between the second protrusions to partially expose the sidewalls of the second protrusions;
removing the bottom portions of the second protrusions; and
forming the second insulative layers under the top portions of the second protrusions.

15. The method of claim 12, further comprising replacing another portion of the first semiconductor structures with a plurality of third semiconductor structures having a different material from that of the first semiconductor structures and that of the second semiconductor structures.

16. A semiconductor device, comprising:
a semiconductor substrate including a surface, and a plurality of protrusions protruded from the surface of the semiconductor substrate;
an insulative layer over the semiconductor substrate;
a plurality of stacked semiconductor channels over the insulative layer, wherein the plurality of stacked semiconductor channels are substantially aligned with the plurality of protrusions, and apart from the plurality of protrusions by the insulative layer, and each of the stacked semiconductor channels comprises a bottom semiconductor channel and an upper semiconductor channel over the bottom semiconductor channel; and
a plurality of spacers covering sidewalls of the bottom semiconductor channels of the stacked semiconductor channels, and exposing sidewalls of the upper semiconductor channels of the stacked semiconductor channels.

17. The semiconductor device of claim 16, wherein a thickness of each bottom semiconductor channel is less than a critical thickness of a material for each bottom semiconductor channel.

18. The semiconductor device of claim 17, wherein a material for each upper semiconductor channel of a portion of the stacked semiconductor channels is different from a material for each upper semiconductor channel of another portion of the stacked semiconductor channels.

19. The semiconductor device of claim 16, wherein the upper semiconductor channel of a portion of the stacked semiconductor channels comprise a stack of a first semiconductor structure and a second semiconductor structure, and a material of the first semiconductor structure and a material of the second semiconductor structure have different lattice constants.

20. The semiconductor device of claim 16, wherein the upper semiconductor channel of a first portion of the stacked semiconductor channels comprise a stack of a first semiconductor structure and a second semiconductor structure, the upper semiconductor channel of a second portion of the stacked semiconductor channels comprise a stack of the first semiconductor structure and a third semiconductor structure, and a material of the second semiconductor structure and a material of the third semiconductor structure have different lattice constants.

* * * * *